(12) United States Patent
Chua et al.

(10) Patent No.: US 7,837,838 B2
(45) Date of Patent: *Nov. 23, 2010

(54) METHOD OF FABRICATING A HIGH DIELECTRIC CONSTANT TRANSISTOR GATE USING A LOW ENERGY PLASMA APPARATUS

(75) Inventors: Thai Cheng Chua, Cupertino, CA (US);
Alex M. Paterson, San Jose, CA (US);
Steven Hung, Sunnyvale, CA (US);
Patricia M. Liu, Saratoga, CA (US);
Tatsuya Sato, Cupertino, CA (US);
Valentin Todorow, Palo Alto, CA (US);
John P. Holland, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 468 days.

This patent is subject to a terminal disclaimer.

(21) Appl. No.: 11/614,027

(22) Filed: Dec. 20, 2006

(65) Prior Publication Data
US 2007/0218623 A1 Sep. 20, 2007

Related U.S. Application Data

(60) Provisional application No. 60/781,508, filed on Mar. 9, 2006.

(51) Int. Cl.
*C23C 14/34* (2006.01)
(52) U.S. Cl. .............................. 204/192.22; 204/192.12; 204/192.15; 204/192.23; 204/298.06; 204/298.08
(58) Field of Classification Search ............ 204/192.12, 204/192.15, 192.22, 192.23, 298.08, 298.06
See application file for complete search history.

(56) References Cited

U.S. PATENT DOCUMENTS 3,427,514 A 2/1969 Olmstead et al.

(Continued)

FOREIGN PATENT DOCUMENTS

EP 0 232 619 A2 8/1987

(Continued)

OTHER PUBLICATIONS

Machine Translation of JP 11-158620 Jun. 15, 1999.*

(Continued)

*Primary Examiner*—Rodney G McDonald
(74) *Attorney, Agent, or Firm*—Patterson & Sheridan, LLP

(57) ABSTRACT

The present invention generally provides methods and apparatuses that are adapted to form a high quality dielectric gate layer on a substrate. Embodiments contemplate a method wherein a metal plasma treatment process is used in lieu of a standard nitridization process to form a high dielectric constant layer on a substrate. Embodiments further contemplate an apparatus adapted to "implant" metal ions of relatively low energy in order to reduce ion bombardment damage to the gate dielectric layer, such as a silicon dioxide layer and to avoid incorporation of the metal atoms into the underlying silicon. In general, the process includes the steps of forming a high-k dielectric and then terminating the surface of the deposited high-k material to form a good interface between the gate electrode and the high-k dielectric material. Embodiments of the invention also provide a cluster tool that is adapted to form a high-k dielectric material, terminate the surface of the high-k dielectric material, perform any desirable post treatment steps, and form the polysilicon and/or metal gate layers.

27 Claims, 24 Drawing Sheets

U.S. PATENT DOCUMENTS

| | | | |
|---|---|---|---|
| 3,594,295 A | 7/1971 | Meckel et al. | |
| 3,767,551 A * | 10/1973 | Lang et al. | 204/192.12 |
| 4,043,848 A | 8/1977 | Bazin | |
| 4,096,509 A | 6/1978 | Blaha et al. | |
| 4,262,631 A | 4/1981 | Kubacki | |
| 4,310,380 A | 1/1982 | Flamm et al. | |
| 4,335,391 A | 6/1982 | Morris | |
| 4,412,119 A | 10/1983 | Komatsu et al. | |
| 4,439,463 A | 3/1984 | Miller | |
| 4,459,739 A | 7/1984 | Shepherd et al. | |
| 4,495,219 A | 1/1985 | Kato et al. | |
| 4,534,826 A | 8/1985 | Goth et al. | |
| 4,545,112 A | 10/1985 | Holmberg et al. | |
| 4,563,367 A | 1/1986 | Sherman | |
| 4,585,516 A | 4/1986 | Corn et al. | |
| 4,605,947 A | 8/1986 | Price et al. | |
| 4,608,063 A | 8/1986 | Kurokawa | |
| 4,651,185 A | 3/1987 | Holmberg et al. | |
| 4,693,805 A * | 9/1987 | Quazi | 204/192.22 |
| 4,700,458 A | 10/1987 | Suzuki et al. | |
| 4,725,560 A | 2/1988 | Abernathey et al. | |
| 4,743,953 A | 5/1988 | Toyokura et al. | |
| 4,745,082 A | 5/1988 | Kwok | |
| 4,851,370 A | 7/1989 | Doklan et al. | |
| 4,913,929 A | 4/1990 | Moslehi et al. | |
| 4,948,458 A | 8/1990 | Ogle | |
| 4,980,307 A | 12/1990 | Ito et al. | |
| 5,000,113 A | 3/1991 | Wang et al. | |
| 5,063,431 A | 11/1991 | Ohshima | |
| RE34,106 E * | 10/1992 | Ohmi | 204/298.08 |
| 5,173,442 A | 12/1992 | Carey | |
| 5,228,950 A | 7/1993 | Webb et al. | |
| 5,292,673 A | 3/1994 | Shinriki et al. | |
| 5,302,236 A | 4/1994 | Tahara et al. | |
| 5,314,724 A | 5/1994 | Tsukune et al. | |
| 5,335,138 A | 8/1994 | Sandhu et al. | |
| 5,391,510 A | 2/1995 | Hsu et al. | |
| 5,464,783 A | 11/1995 | Kim et al. | |
| 5,582,866 A | 12/1996 | White | |
| 5,619,051 A | 4/1997 | Endo | |
| 5,688,382 A | 11/1997 | Besen et al. | |
| 5,726,087 A | 3/1998 | Tseng et al. | |
| 5,763,922 A | 6/1998 | Chau | |
| 5,834,343 A | 11/1998 | Ogasawara et al. | |
| 5,840,626 A | 11/1998 | Ohguro | |
| 5,851,602 A | 12/1998 | Law et al. | |
| 5,861,197 A | 1/1999 | Law et al. | |
| 5,865,896 A | 2/1999 | Nowak et al. | |
| 5,874,766 A | 2/1999 | Hori | |
| 5,880,508 A | 3/1999 | Wu | |
| 5,891,798 A | 4/1999 | Doyle et al. | |
| 5,928,732 A | 7/1999 | Law et al. | |
| 5,935,373 A | 8/1999 | Koshimizu | |
| 5,937,303 A | 8/1999 | Gardner et al. | |
| 5,960,270 A | 9/1999 | Misra et al. | |
| 5,976,993 A | 11/1999 | Ravi et al. | |
| 6,008,095 A | 12/1999 | Gardner et al. | |
| 6,013,553 A | 1/2000 | Wallace et al. | |
| 6,020,024 A | 2/2000 | Maiti et al. | |
| 6,020,243 A | 2/2000 | Wallace et al. | |
| 6,023,613 A | 2/2000 | Kanehara | |
| 6,027,961 A | 2/2000 | Maiti et al. | |
| 6,033,963 A | 3/2000 | Huang et al. | |
| 6,041,734 A | 3/2000 | Raoux et al. | |
| 6,043,157 A | 3/2000 | Gardner et al. | |
| 6,049,114 A | 4/2000 | Maiti et al. | |
| 6,054,013 A | 4/2000 | Collins et al. | |
| 6,060,755 A | 5/2000 | Ma et al. | |
| 6,063,704 A | 5/2000 | Demirlioglu | |
| 6,066,533 A | 5/2000 | Yu | |
| 6,077,403 A | 6/2000 | Kobayashi et al. | |
| 6,083,836 A | 7/2000 | Rodder | |
| 6,087,231 A | 7/2000 | Xiang et al. | |
| 6,090,653 A | 7/2000 | Wu | |
| 6,093,590 A | 7/2000 | Lou | |
| 6,110,287 A | 8/2000 | Arai et al. | |
| 6,117,279 A | 9/2000 | Smolanoff et al. | |
| 6,130,123 A | 10/2000 | Liang et al. | |
| 6,136,654 A | 10/2000 | Kraft et al. | |
| 6,140,024 A | 10/2000 | Misium et al. | |
| 6,140,688 A | 10/2000 | Gardner et al. | |
| 6,162,709 A | 12/2000 | Raoux et al. | |
| 6,171,900 B1 | 1/2001 | Sun | |
| 6,171,910 B1 | 1/2001 | Hobbs et al. | |
| 6,184,072 B1 | 2/2001 | Kaushik et al. | |
| 6,184,114 B1 | 2/2001 | Lukanc | |
| 6,190,513 B1 | 2/2001 | Forster et al. | |
| 6,200,893 B1 | 3/2001 | Sneh | |
| 6,203,613 B1 | 3/2001 | Gates et al. | |
| 6,207,304 B1 | 3/2001 | Law et al. | |
| 6,210,999 B1 * | 4/2001 | Gardner et al. | 438/183 |
| 6,214,162 B1 | 4/2001 | Koshimizu | |
| 6,228,229 B1 | 5/2001 | Raaijmakers et al. | |
| 6,235,650 B1 | 5/2001 | Yao | |
| 6,244,211 B1 | 6/2001 | Nishikawa et al. | |
| 6,254,738 B1 | 7/2001 | Stimson et al. | |
| 6,254,746 B1 | 7/2001 | Subramani et al. | |
| 6,255,231 B1 | 7/2001 | Chen et al. | |
| 6,255,698 B1 | 7/2001 | Gardner et al. | |
| 6,258,675 B1 | 7/2001 | Gardner et al. | |
| 6,264,812 B1 | 7/2001 | Raaijmakers et al. | |
| 6,277,253 B1 | 8/2001 | Narasimhan et al. | |
| 6,287,635 B1 | 9/2001 | Cook et al. | |
| 6,291,282 B1 | 9/2001 | Wilk et al. | |
| 6,297,107 B1 | 10/2001 | Paton et al. | |
| 6,297,539 B1 | 10/2001 | Ma et al. | |
| 6,297,595 B1 | 10/2001 | Stimson et al. | |
| 6,303,481 B2 | 10/2001 | Park | |
| 6,320,238 B1 | 11/2001 | Kizilyalli et al. | |
| 6,344,419 B1 | 2/2002 | Forster et al. | |
| 6,345,588 B1 | 2/2002 | Simson | |
| 6,346,465 B1 | 2/2002 | Miura et al. | |
| 6,348,126 B1 | 2/2002 | Hanawa et al. | |
| 6,348,386 B1 | 2/2002 | Gilmer | |
| 6,352,594 B2 | 3/2002 | Cook et al. | |
| 6,354,593 B1 | 3/2002 | Frommer et al. | |
| 6,355,108 B1 | 3/2002 | Won et al. | |
| 6,358,810 B1 | 3/2002 | Dornfest et al. | |
| 6,361,667 B1 | 3/2002 | Kobayashi et al. | |
| 6,365,450 B1 | 4/2002 | Kim | |
| 6,365,518 B1 | 4/2002 | Lee et al. | |
| 6,373,111 B1 | 4/2002 | Zheng et al. | |
| 6,376,807 B1 | 4/2002 | Hong et al. | |
| 6,399,520 B1 | 6/2002 | Kawakami et al. | |
| 6,413,382 B1 | 7/2002 | Wang et al. | |
| 6,420,279 B1 | 7/2002 | Ono et al. | |
| 6,436,801 B1 | 8/2002 | Wilk et al. | |
| 6,444,099 B1 | 9/2002 | Sasaki et al. | |
| 6,444,592 B1 | 9/2002 | Ballantine et al. | |
| 6,447,636 B1 | 9/2002 | Qian et al. | |
| 6,448,166 B2 | 9/2002 | Cho et al. | |
| 6,461,483 B1 | 10/2002 | Gopalraja et al. | |
| 6,472,337 B1 | 10/2002 | Zhuang et al. | |
| 6,475,854 B2 | 11/2002 | Narwankar et al. | |
| 6,475,908 B1 | 11/2002 | Lin et al. | |
| 6,477,980 B1 | 11/2002 | White et al. | |
| 6,482,752 B1 | 11/2002 | Yamazaki et al. | |
| 6,486,080 B2 | 11/2002 | Chooi et al. | |
| 6,495,474 B1 | 12/2002 | Rafferty et al. | |
| 6,497,796 B1 | 12/2002 | Ashtiani et al. | |
| 6,500,742 B1 | 12/2002 | Chern et al. | |
| 6,504,214 B1 | 1/2003 | Yu et al. | |
| 6,506,287 B1 | 1/2003 | Ding | |
| 6,506,676 B2 | 1/2003 | Park et al. | |

| | | | | | | |
|---|---|---|---|---|---|---|
| 6,511,875 B2 | 1/2003 | Park et al. | | 7,217,611 B2 | 5/2007 | Kavalieros et al. |
| 6,511,925 B1 | 1/2003 | Aronowitz et al. | | 7,217,665 B2 | 5/2007 | Nallan et al. |
| 6,514,828 B2 | 2/2003 | Ahn et al. | | 7,220,635 B2 | 5/2007 | Brask et al. |
| 6,528,856 B1 | 3/2003 | Bai et al. | | 7,235,501 B2 | 6/2007 | Ahn et al. |
| 6,528,858 B1 | 3/2003 | Yu et al. | | 7,242,055 B2 | 7/2007 | Bojarczuk, Jr. et al. |
| 6,541,079 B1 | 4/2003 | Bojarczuk, Jr. et al. | | 7,279,413 B2 | 10/2007 | Park et al. |
| 6,544,906 B2 | 4/2003 | Rotondaro et al. | | 7,294,581 B2 | 11/2007 | Iyer et al. |
| 6,548,366 B2 | 4/2003 | Niimi et al. | | 7,304,004 B2 | 12/2007 | Metzner et al. |
| 6,548,368 B1 | 4/2003 | Narwankar et al. | | 7,645,710 B2 * | 1/2010 | Olsen et al. ............. 438/783 |
| 6,551,446 B1 | 4/2003 | Hanawa et al. | | 2001/0049186 A1 | 12/2001 | Ibok |
| 6,554,979 B2 | 4/2003 | Stimson | | 2001/0055889 A1 | 12/2001 | Iyer |
| 6,610,374 B2 | 8/2003 | Tsai et al. | | 2002/0023900 A1 | 2/2002 | Mahawili |
| 6,610,615 B1 | 8/2003 | McFadden et al. | | 2002/0066537 A1 | 6/2002 | Ogino et al. |
| 6,617,209 B1 | 9/2003 | Chau et al. | | 2002/0142624 A1 | 10/2002 | Levy et al. |
| 6,617,266 B2 | 9/2003 | Nickles et al. | | 2002/0177293 A1 | 11/2002 | Wilk et al. |
| 6,620,670 B2 | 9/2003 | Song et al. | | 2002/0197883 A1 | 12/2002 | Niimi et al. |
| 6,627,322 B2 | 9/2003 | Choi et al. | | 2003/0027392 A1 | 2/2003 | Gousev et al. |
| 6,632,747 B2 | 10/2003 | Niimi et al. | | 2003/0034244 A1 * | 2/2003 | Yasar et al. ............. 204/192.3 |
| 6,638,877 B2 | 10/2003 | Rotondaro | | 2003/0116854 A1 | 6/2003 | Ito et al. |
| 6,641,703 B2 | 11/2003 | Nomura et al. | | 2003/0121886 A1 | 7/2003 | Strang et al. |
| 6,649,538 B1 | 11/2003 | Cheng et al. | | 2003/0143328 A1 | 7/2003 | Chen et al. |
| 6,652,924 B2 | 11/2003 | Sherman | | 2003/0151372 A1 | 8/2003 | Tsuchiya et al. |
| 6,653,698 B2 | 11/2003 | Lee et al. | | 2003/0181012 A1 | 9/2003 | Wang et al. |
| 6,660,134 B1 | 12/2003 | Gopalraja | | 2003/0205772 A1 | 11/2003 | Schaeffer et al. |
| 6,660,659 B1 | 12/2003 | Kraus et al. | | 2003/0230549 A1 | 12/2003 | Buchanan et al. |
| 6,661,058 B2 | 12/2003 | Ahn et al. | | 2003/0232491 A1 | 12/2003 | Wamaguchi |
| 6,664,160 B2 | 12/2003 | Park et al. | | 2003/0232501 A1 | 12/2003 | Kher et al. |
| 6,673,724 B2 | 1/2004 | Forster et al. | | 2004/0020601 A1 | 2/2004 | Zhao et al. |
| 6,675,816 B2 | 1/2004 | Ichijo | | 2004/0031985 A1 | 2/2004 | Inoue et al. |
| 6,677,254 B2 | 1/2004 | Narwankar et al. | | 2004/0038486 A1 | 2/2004 | Chua et al. |
| 6,682,973 B1 | 1/2004 | Paton et al. | | 2004/0038487 A1 | 2/2004 | Olsen |
| 6,689,646 B1 | 2/2004 | Joshi et al. | | 2004/0053472 A1 | 3/2004 | Kiryu et al. |
| 6,703,277 B1 | 3/2004 | Paton et al. | | 2004/0092073 A1 | 5/2004 | Cabral et al. |
| 6,719,883 B2 | 4/2004 | Stimson | | 2004/0094808 A1 | 5/2004 | Joshi et al. |
| 6,740,941 B2 | 5/2004 | Moriwaki et al. | | 2004/0135180 A1 | 7/2004 | Makita |
| 6,743,473 B1 | 6/2004 | Parkhe et al. | | 2004/0142577 A1 | 7/2004 | Sugawara et al. |
| 6,750,126 B1 | 6/2004 | Visokay et al. | | 2004/0175961 A1 | 9/2004 | Olsen |
| 6,759,286 B2 | 7/2004 | Kumar et al. | | 2004/0198069 A1 | 10/2004 | Metzner et al. |
| 6,765,178 B2 | 7/2004 | Shang et al. | | 2004/0209468 A1 | 10/2004 | Kumar et al. |
| 6,767,824 B2 | 7/2004 | Nallan et al. | | 2004/0242021 A1 | 12/2004 | Kraus et al. |
| 6,777,346 B2 | 8/2004 | Iyer | | 2005/0009358 A1 | 1/2005 | Choi et al. |
| 6,780,720 B2 | 8/2004 | Burnham et al. | | 2005/0130448 A1 | 6/2005 | Olsen |
| 6,784,033 B1 | 8/2004 | Yamazaki | | 2005/0136656 A1 | 6/2005 | Zeng et al. |
| 6,790,755 B2 | 9/2004 | Jeon | | 2005/0186765 A1 | 8/2005 | Ma et al. |
| 6,806,095 B2 | 10/2004 | Nallan et al. | | 2005/0230047 A1 | 10/2005 | Collins et al. |
| 6,806,653 B2 | 10/2004 | Strang et al. | | 2005/0260347 A1 | 11/2005 | Narwankar et al. |
| 6,821,873 B2 | 11/2004 | Visokay et al. | | 2005/0260357 A1 | 11/2005 | Olsen |
| 6,824,658 B2 | 11/2004 | Gopalraja et al. | | 2005/0271812 A1 | 12/2005 | Myo et al. |
| 6,831,021 B2 | 12/2004 | Chua et al. | | 2005/0271813 A1 | 12/2005 | Kher et al. |
| 6,841,439 B1 | 1/2005 | Anthony et al. | | 2005/0287740 A1 | 12/2005 | Wu et al. |
| 6,846,516 B2 | 1/2005 | Yang et al. | | 2006/0019033 A1 | 1/2006 | Muthukrishnan et al. |
| 6,855,643 B2 | 2/2005 | Nallan et al. | | 2006/0032833 A1 | 2/2006 | Kawaguchi et al. |
| 6,858,547 B2 | 2/2005 | Metzner et al. | | 2006/0042755 A1 | 3/2006 | Holmberg et al. |
| 6,864,145 B2 | 3/2005 | Hareland et al. | | 2006/0060565 A9 | 3/2006 | Nallan et al. |
| 6,902,681 B2 | 6/2005 | Nallan et al. | | 2006/0062917 A1 | 3/2006 | Muthukrishnan et al. |
| 6,911,399 B2 | 6/2005 | Liu et al. | | 2006/0153995 A1 | 7/2006 | Narwankar et al. |
| 6,919,251 B2 | 7/2005 | Rotondaro et al. | | 2006/0178018 A1 | 8/2006 | Olsen |
| 6,924,191 B2 | 8/2005 | Liu et al. | | 2006/0208215 A1 | 9/2006 | Metzner et al. |
| 6,946,408 B2 | 9/2005 | Le et al. | | 2006/0244035 A1 | 11/2006 | Bojarczuk et al. |
| 6,960,537 B2 | 11/2005 | Shero et al. | | 2006/0264067 A1 | 11/2006 | Kher et al. |
| 6,982,230 B2 | 1/2006 | Cabral, Jr. et al. | | 2006/0286763 A1 | 12/2006 | Ma et al. |
| 6,998,357 B2 | 2/2006 | Bai et al. | | 2007/0018244 A1 | 1/2007 | Hung et al. |
| 7,023,064 B2 | 4/2006 | Park et al. | | 2007/0020890 A1 | 1/2007 | Thakur et al. |
| 7,064,066 B1 | 6/2006 | Metz et al. | | 2007/0026547 A1 | 2/2007 | Kumar et al. |
| 7,067,439 B2 | 6/2006 | Metzner et al. | | 2007/0042601 A1 | 2/2007 | Wang et al. |
| 7,084,024 B2 | 8/2006 | Gluschenkov et al. | | 2007/0049043 A1 | 3/2007 | Muthukrishnan et al. |
| 7,094,613 B2 | 8/2006 | Mui et al. | | 2007/0049053 A1 | 3/2007 | Mahajani |
| 7,094,704 B2 | 8/2006 | Jin et al. | | 2007/0077767 A1 | 4/2007 | Jin et al. |
| 7,105,889 B2 | 9/2006 | Bojarczuk, Jr. et al. | | 2007/0087583 A1 | 4/2007 | Olsen et al. |
| 7,122,454 B2 | 10/2006 | Olsen | | 2007/0093012 A1 | 4/2007 | Chua et al. |
| 7,175,713 B2 | 2/2007 | Thakur et al. | | 2007/0099438 A1 | 5/2007 | Ye et al. |
| 7,179,754 B2 | 2/2007 | Kraus et al. | | 2007/0111458 A1 | 5/2007 | Sato et al. |
| 7,208,361 B2 | 4/2007 | Shah et al. | | 2007/0141856 A1 | 6/2007 | Sato et al. |

| 2007/0199922 | A1 | 8/2007 | Shen et al. |
| 2007/0209930 | A1 | 9/2007 | Chua et al. |
| 2007/0212896 | A1 | 9/2007 | Olsen et al. |
| 2007/0218623 | A1 | 9/2007 | Chua et al. |

FOREIGN PATENT DOCUMENTS

| EP | 0847079 | | 6/1998 |
| JP | 11-158620 | * | 6/1999 |
| TW | 386267 | | 4/2000 |
| TW | 480569 | | 3/2002 |
| TW | 490765 | | 6/2002 |
| TW | 556268 | | 10/2003 |

OTHER PUBLICATIONS

Applied Materials Instruction Manual, "AMP 3300 Plasma I—Low Temperature Nitride Reactor System", Semiconductor Systems Division, Protective Order—Civil No. 02-CV-3457, dated Jan. 18, 1979.

International Search Report dtd. Oct. 17, 2007.

H. Nakanishi et al., "Studies on $SiO_2$- $SiO_2$ Bonding with Hydrofluoric Acid—Room Temperature and Low Stress Bonding Technique for Mems—"; IEEE, 1998, pp. 609-614.

Kasprzak et al., "Near-Ideal Si-$SiO_2$ Interfaces", IBM J. Res. Develop, vol. 24, No. 3 May 1980, pp. 348-352.

D.R. Cote et al., "Plasma-Assisted Chemical Vapor Deposition of Dielectric Thin Films for ULSI Semiconductor Circuits", IBM J. Res. Develop, vol. 43, No. 1/2, Jan./Mar. 1999, pp. 5-38.

H. F. Okorn-Schmidt, "Characterization of Silicon Surface Preparation Processes for Advanced Gate Dielectrics", IBM J. Res. Develop, vol. 43, No. 3, May 1999, pp. 351-365.

Y. Kuo et al., "Plasma Processing in the Fabrication of Amorphous Silicon Thin-Films-Transistor Arrays" IBM J. Res. Develop. vol. 43, No. 1/2, Jan./Mar. 1999, pp. 73-88.

H. Carre et al., "Semiconductor Manufacturing Technology at IBM", IBM J. Res. Develop. vol. 26, No. 5, Sep. 1982, pp. 528-531.

R. H. Collins et al., "Silicon Process Technology for Monolithic Memory", IBM J. Res. Develop. Jan. 1972, pp. 2-10.

A.T. Fromhold, Jr. et al., "Oxide Growth in an rf Plasma", J. Appl. Phys. 51(12) Dec. 1980, pp. 6377-6392.

P.K. Roy et al., "Stacked High-∈ Gate Dielectric for Gigascale Integrated of Metal-Oxide-Semiconductor Technologies", Applied Physics Letters, vol. 72, No. 22, Jun. 1, 1998, pp. 2835-2837.

D. W. Hess, "Plasma-Assisted Oxidation Anodization, and Nitridation of Silicon", IBM J. Res. Develop, vol. 43, No. 1/2, Jan./Mar. 1999, pp. 127-145.

S.A. Nelson et al., "A Structural and Electrical Comparison of Thin $SiO_2$ Films Grown on Silicon by Plasma Anodization and Rapid Thermal Processing to Furnace Oxidation", Applied Physics Letters, vol. 63, No. 10, May 15, 1988, pp. 5027-5035.

S. Taylor et al., "A Review of the Plasma Oxidation of Silicon and its Applications" Semiconductor Science Tech. vol. 8, 1993, pp. 1426-1433, (Received Nov. 5, 1992.).

P. Freidal, et al., "Review of Oxidation Processes in Plasmas", J. Physics Chem. Solids, vol. 44, No. 5, pp. 353-364, 1983.

Y. Kawai, et al., "Ultra-Low-Temperature Growth of High-Integrity Gate Oxide Films by Low-Energy Ion-Assisted Oxidation", Applied Physics Letters, vol. 64, No. 17, Apr. 25, 1994, pp. 2223-2225.

Deen, et al. Proceedings of the Symposium on "Silicon Nitride and Silicon Dioxide Thin Insulating Films", 1994, Electrochemical Society, Inc. vol. 97-10 pp. 229-243.

D.L. Pulfrey, et al., "Preparation and Properties of Plasma-Anodized Silicon Dioxide Films" Solid State Electronics, 1974, vol. 17, pp. 627-632, Received on (Sep. 1973).

S. Gourrier, et al., "Review of Oxide Formation in a Plasma", Plasma Chemistry and Plasma Processing vol. 1, No. 3, 1982, pp. 217-232 (Received Jan. 19, 1981).

D.L. Pulfrey, et al., "The Anodization of Si in an RF Plasma", Solid State Science and Technology, 1974, vol. 120, No. 11, pp. 1529-1535, Nov. 1972.

A. Reisman, "Assisted Oxidation and Annealing in VLSI and ULSI" Department of Electrical and Comptuer Engineering, 1986, pp. 364-378.

John F. O'Hanlon, "Gas Discharge Anodization", Oxides and Oxide Films, vol. 5, A.K. Vijh, Ed., Marcel Dekker, New York, 1977, IBM Corporation Chpt. 2, pp. 105-166.

C.J. Dell'oca, et al., "Anodic Oxide Films", Physics of Thin Films, vol. 6, H. Francombe and R. W. Hoffmann, Eds., Academic Press, Inc., New York, 1971, pp. 1-79.

Nelson et al., "Thin Silicon Oxides Grown by Low-Temperature RF Plasma Anodization and Deposition".

Vossen, et al., "Thin Film Processes", Academic Press Inc. 1978 Chpt II. pp. 24-73.

Oana, Yasuhisa "5.1: Current & Future Technology of Low Temperature Poly-Si TFT—LCDs" Toshiba Corporation pp. 1-4.

Singer, Peter "High-K, Metal Gates a 'Go' for 45 nm" Semiconductor International Reed Business Information 2007.

Prosecution History of U.S. Appl. No. 11/614,019 as of May 20, 2009.

Prosecution History of U.S. Appl. No. 11/683,984 as of May 20, 2009.

Response to Office Action filed May 29, 2009 in U.S. Appl. No. 11/683,984.

Prosecution History of U.S. Appl. No. 11/683,984 as of Dec. 14, 2009.

Prosecution History of U.S. Appl. No. 11/614,019 as of Dec. 14, 2009.

Prosecution History of U.S. Appl. No. 11/614,022 as of Dec. 14, 2009.

First Office Action issued Jan. 29, 2010 in Chinese Patent Application No. 200780008358.7.

* cited by examiner

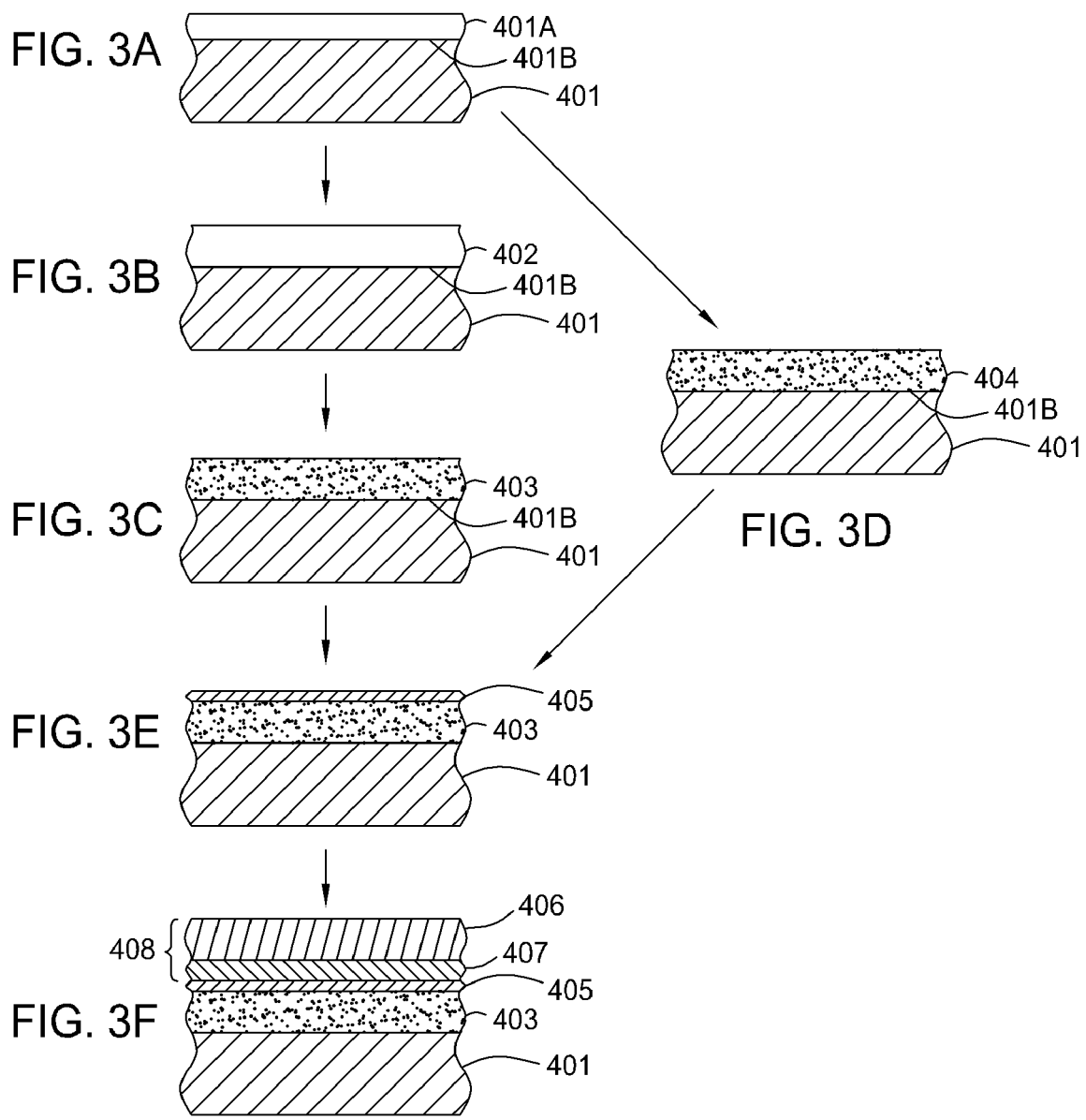

| GAS USED | MASS | Hf TARGET | | La TARGET | |
|---|---|---|---|---|---|
| | | ENERGY TRANSFER MASS FACTOR | SPUTTERING THRESHOLD ENERGY (eV) | ENERGY TRANSFER MASS FACTOR | SPUTTERING THRESHOLD ENERGY (eV) |
| Ar | 40 | 0.599 | 42.3 | 0.694 | 25.5 |
| Kr | 83.8 | 0.871 | 29.12 | 0.939 | 18.8 |
| Xe | 131.3 | 0.977 | 25.85 | 0.999 | 17.7 |

FIG. 4D

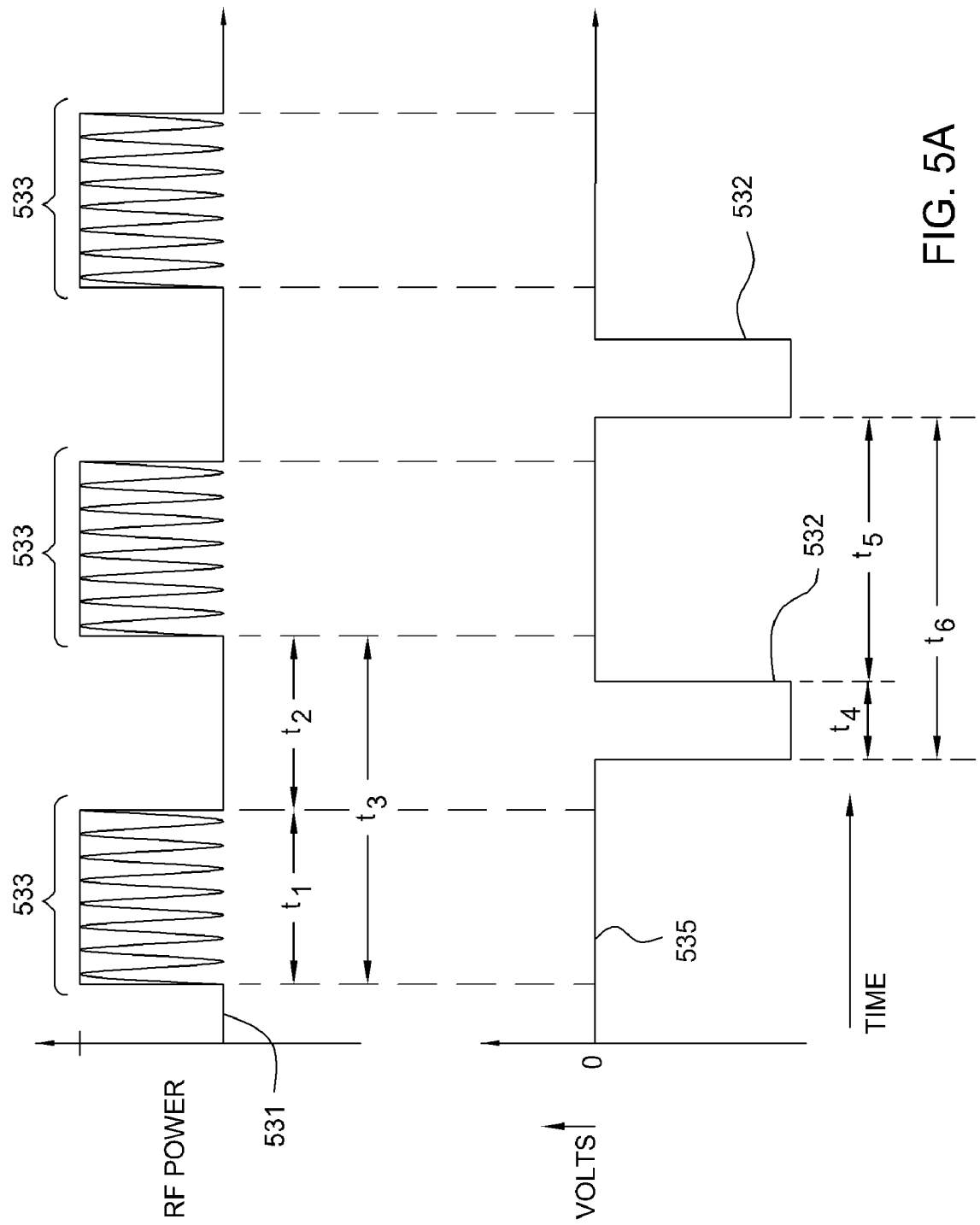

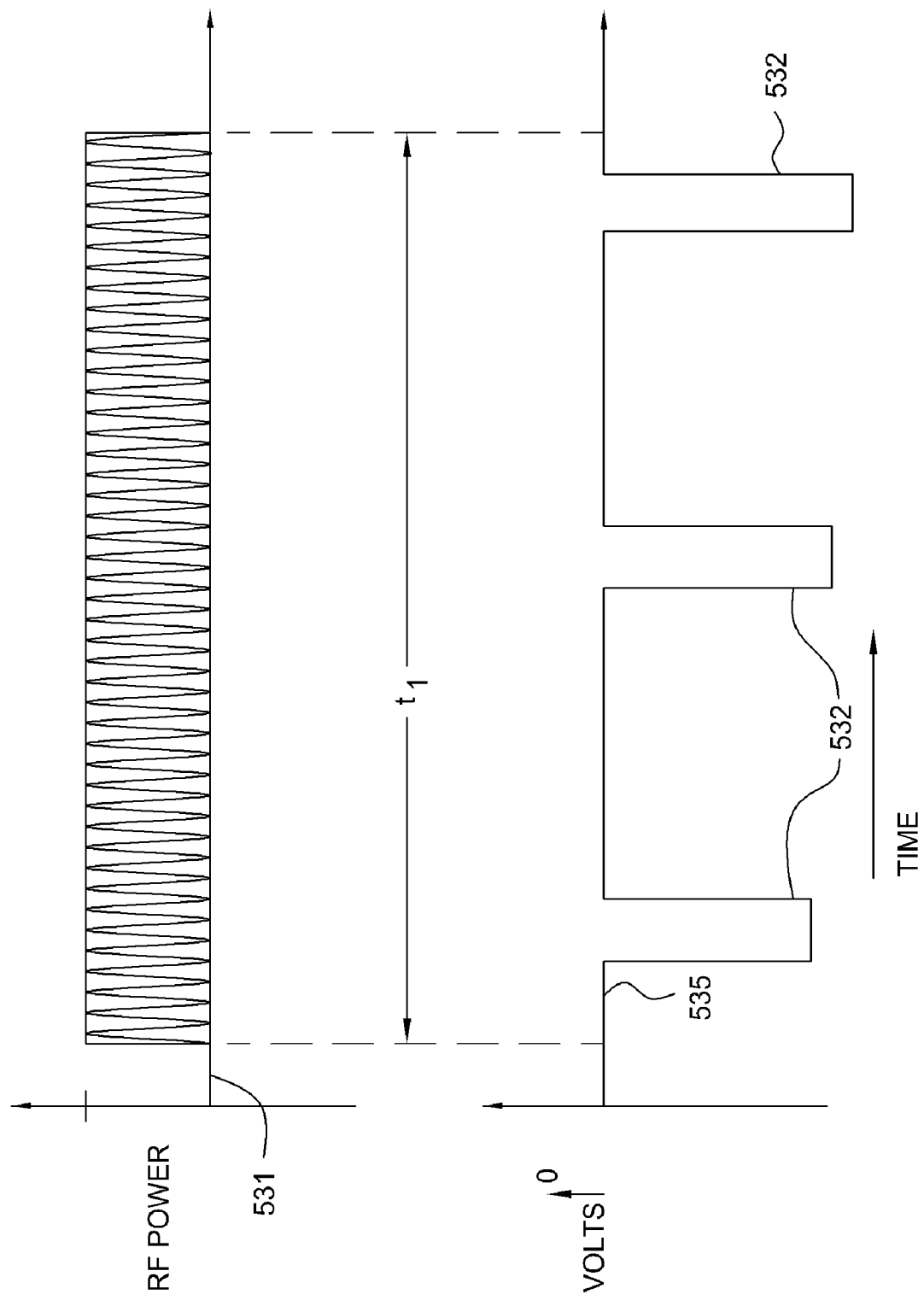

METHOD OF FABRICATING A HIGH DIELECTRIC CONSTANT TRANSISTOR GATE USING A LOW ENERGY PLASMA APPARATUS

CROSS-REFERENCE TO RELATED APPLICATIONS

This application claims benefit of U.S. provisional patent application Ser. No. 60/781,508, filed Mar. 9, 2006, which is herein incorporated by reference. This application is also related to co-pending U.S. patent application Ser. No. 11/614,019 filed Dec. 20, 2006, U.S. patent application Ser. No. 11/614,022 filed Dec. 20, 2006, and U.S. patent application Ser. No. 11/683,984 filed Mar. 8, 2007.

BACKGROUND OF THE INVENTION

1. Field of the Invention

Embodiments of the present invention generally relate to a method and an apparatus of forming a high-k dielectric layer. More particularly, embodiments of the invention relate to a method of forming a gate dielectric layer.

2. Description of the Related Art

Integrated circuits are composed of many, e.g., millions, of devices such as transistors, capacitors, and resistors. Transistors, such as field effect transistors, typically include a source, a drain, and a gate stack. The gate stack typically includes a substrate, such as a silicon substrate, a gate dielectric, and a gate electrode, such as polycrystalline silicon, on the gate dielectric. The gate dielectric layer is formed of dielectric materials such as silicon dioxide ($SiO_2$), or a high-K dielectric material having a dielectric constant greater than 4.0, such as SiON, SiN, hafnium oxide ($HfO_2$), hafnium silicate (Hf-$SiO_2$), hafnium silicon oxynitride (HfSiON), zirconium oxide ($ZrO_2$), Zirconium silicate ($ZrSiO_2$), barium strontium titanate ($BaSrTiO_3$, or BST), lead zirconate titanate (Pb(ZrTi)$O_3$, or PZT), and the like. It should be noted, however, that the film stack may comprise layers formed of other materials.

FIG. 1A shows a cross section of FET (field effect transistor) 10 incorporating a gate dielectric layer 14. The figure shows a substrate 12 on which a gate dielectric layer 14 and gate electrode 16 are disposed. Side wall spacers 18 are shown adjacent to the vertical sidewalls of gate dielectric layer 14 and gate electrode 16. Source/drain junctions 13 are formed in substrate 12 substantially adjacent the opposing vertical sidewalls of gate electrode 16.

As integrated circuit sizes and the sizes of the transistors thereon decrease, the gate drive current required to increase the speed of the transistor has increased. The drive current increases as the gate capacitance increases, and capacitance=kA/d, wherein k is the dielectric constant of the gate, d is the dielectric thickness, and A is the area of the device. Decreasing the dielectric thickness and increasing the dielectric constant of the gate dielectric are methods of increasing the gate capacitance and the drive current.

Attempts have been made to reduce the thickness of $SiO_2$ gate dielectrics below 20 Å. However, it has been found that the use of $SiO_2$ gate dielectrics below 20 Å often results in undesirable effects on gate performance and durability. For example, boron from a boron doped gate electrode can penetrate through a thin $SiO_2$ gate dielectric into the underlying silicon substrate. Also, there is typically an increase in gate leakage current, i.e., tunneling current, with thin dielectrics that increases the amount of power consumed by the gate. Thin $SiO_2$ gate dielectrics may be susceptible to NMOS hot carrier degradation, in which high energy carriers traveling across the dielectric can damage or destroy the channel. Thin $SiO_2$ gate dielectrics may also be susceptible to PMOS negative bias temperature instability (NBTI), wherein the threshold voltage or drive current drifts with operation of the gate.

A method of forming a dielectric layer suitable for use as the gate dielectric layer in a MOSFET (metal oxide semiconductor field effect transistor) includes nitridizing a thin silicon oxide film in a nitrogen-containing plasma. Increasing the net nitrogen content in the gate oxide to increase the dielectric constant is desirable for several reasons. For example, the bulk of the oxide dielectric may be lightly incorporated with nitrogen during the plasma nitridation process, which reduces the equivalent oxide thickness (EOT) over the starting oxide. This may result in a gate leakage reduction, due to tunneling during the operation of a FET, at the same EOT as the un-nitrided oxide dielectric. At the same time, such an increased nitrogen content may also reduce damage induced by Fowler-Nordheim (F-N) tunneling currents during subsequent processing operations, provided that the thickness of the dielectric is in the F-N tunneling current range. Another benefit of increasing the net nitrogen content of the gate oxide is that the nitridized gate dielectric is more resistant to the problem of gate etch undercut, which in turn reduces defect states and current leakage at the gate edge.

In U.S. Pat. No. 6,610,615, titled "Plasma Nitridation For Reduced Leakage Gate Dielectric Layers" and issued on Aug. 26, 2003, McFadden et al. compares nitrogen profiles in a silicon oxide film for both thermal and plasma nitridation processes (see FIG. 1B). The nitrided oxide films are disposed on a silicon substrate. FIG. 1B further shows the nitrogen profiles in the crystalline silicon beneath the oxide film. The nitrogen profile data 22 for the thermally nitrided oxide shows a first concentration of nitrogen at a top surface of an oxide layer, a generally declining concentration of nitrogen deeper in the oxide, an interfacial accumulation of nitrogen at the oxide-silicon interface, and finally, a nitrogen concentration gradient that is generally declining with distance into the substrate. In contrast, it can be seen that the plasma nitridation process produces a nitrogen profile 24 that is essentially monotonically decreasing from the top surface of the oxide layer through the oxide-silicon interface and into the substrate. The undesirable interfacial accumulation of nitrogen seen with a thermal nitridation process does not occur with the ionic bombardment of the nitrogen plasma. Furthermore, the nitrogen concentration in the substrate is lower, at all depths, than is achieved with the thermal nitridation process.

As mentioned earlier, a benefit of increasing nitrogen concentration at the gate electrode-gate oxide interface is that dopant, such as boron, out-diffusion from polysilicon gate electrodes into or through the gate oxide is reduced. This improves device reliability by reducing defect states in the bulk of the gate oxide caused by, for example, in-diffused boron from a boron doped polysilicon gate electrode. Another benefit of reducing nitrogen content at the gate oxide-silicon channel interface is the reduction of fixed charge and interface state density. This improves channel mobility and transconductance. Therefore, plasma nitridation process has advantages over thermal nitridation process.

As semiconductor devices become smaller, the size of the silicon nitrided gate oxide layer has reached it practical limit. However, with the further scaling of nitrided silicon dioxide gate dielectric to smaller physical thicknesses (from 10 Å), the gate leakage has increased to unacceptable levels for practical device applications. Since the demand for reduced device sizes remains, new gate dielectric materials and/or processes are needed.

Replacement of silicon dioxide ($SiO_2$) with a high-k dielectric type material has presented challenges. For example, high-k dielectric materials are typically deposited using chemical vapor deposition (CVD) or atomic layer deposition (ALD) techniques that tend to cause the carbon containing precursor material and other contaminants to be incorporated in the deposited film. The carbon and other contaminants adversely affect the dielectric properties of the gate dielectric layer. Also, the quality of the interface between a chemical vapor deposition (CVD) or atomic layer deposition (ALD) deposited high-k film and the channel region is not as robust as a silicon dioxide layer.

Therefore, there is a need in the art for a method and an apparatus for forming a gate dielectric layer that has improved dielectric properties and a smaller EOT.

SUMMARY OF THE INVENTION

The present invention generally provides a method of forming a high-k dielectric layer using a low energy sputtering process, wherein the low energy sputtering process comprises positioning a substrate having a dielectric layer formed thereon in a processing region of a plasma processing chamber, disposing a first material in the dielectric layer using a low energy sputtering process, wherein the low energy sputtering process comprises delivering a plurality of RF energy pulses from a first RF generator to a target comprising the first material, wherein the RF energy of each pulse is delivered at a first RF frequency, and delivering a plurality of DC pulses to the target from a DC source assembly, wherein the plurality of RF energy pulses and the plurality of DC pulses are synchronized.

Embodiments of the invention further provide a method of forming a high-k dielectric layer using a low energy sputtering process, wherein the low energy sputtering process comprises positioning a substrate having a dielectric layer formed thereon in a processing region of a plasma processing chamber, disposing a first material in the dielectric layer using a low energy sputtering process, wherein the low energy sputtering process comprises delivering a first amount of RF energy to a target comprising the first material for a first period of time, wherein the first amount of RF energy is delivered at a first RF frequency, and delivering a second amount of RF energy to the target for a second period of time, wherein the second amount of RF energy is delivered at a second RF frequency, wherein the second frequency is greater than the first frequency.

Embodiments of the invention further provide a method of forming a high-k dielectric layer using a low energy sputtering process, wherein the low energy sputtering process comprises positioning a substrate having a dielectric layer formed thereon in a processing region of a plasma processing chamber, disposing a first material in the dielectric layer using a low energy sputtering process, wherein the low energy sputtering process comprises delivering a plurality of RF energy pulses from a first RF generator to a coil that is in electrical communication with the processing region, wherein the RF energy is delivered at a first RF frequency and a first power, and delivering a plurality of DC pulses to a target comprising the first material from a DC source assembly, wherein the plurality of RF energy pulses and the plurality of DC pulses are synchronized.

Embodiments of the invention further provide a method of forming a high-k dielectric layer using a low energy sputtering process, wherein the low energy sputtering process comprises positioning a substrate having a dielectric layer formed thereon in a processing region of a plasma processing chamber, disposing a first material in the dielectric layer using a low energy sputtering process, wherein the low energy sputtering process comprises delivering a first plurality of RF energy pulses from a first RF generator at a first RF frequency to a coil that is in electrical communication with the processing region, and delivering a second plurality of RF energy pulses from a first RF generator at a second RF frequency to a target that is in electrical communication with the processing region, wherein the plurality of RF energy pulses and the plurality of DC pulses are synchronized.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3F illustrate a series of schematic cross-sectional views of a substrate upon which a gate structure is fabricated using the method of FIG. 2A.

FIG. 4D is a table of theoretical calculations that illustrate the various properties of a hafnium and lanthanum targets according to one embodiment of the invention.

FIG. 5A illustrates the timing of the off-cycle of the pulsed RFNHF excitation energy and pulsed DC voltage applied to a target according to another embodiment of the invention.

FIG. 5C illustrates the timing of the off-cycle of the pulsed DC voltage and continuous RFNHF energy applied to a target according to another embodiment of the invention.

DETAILED DESCRIPTION

Figure 1A:
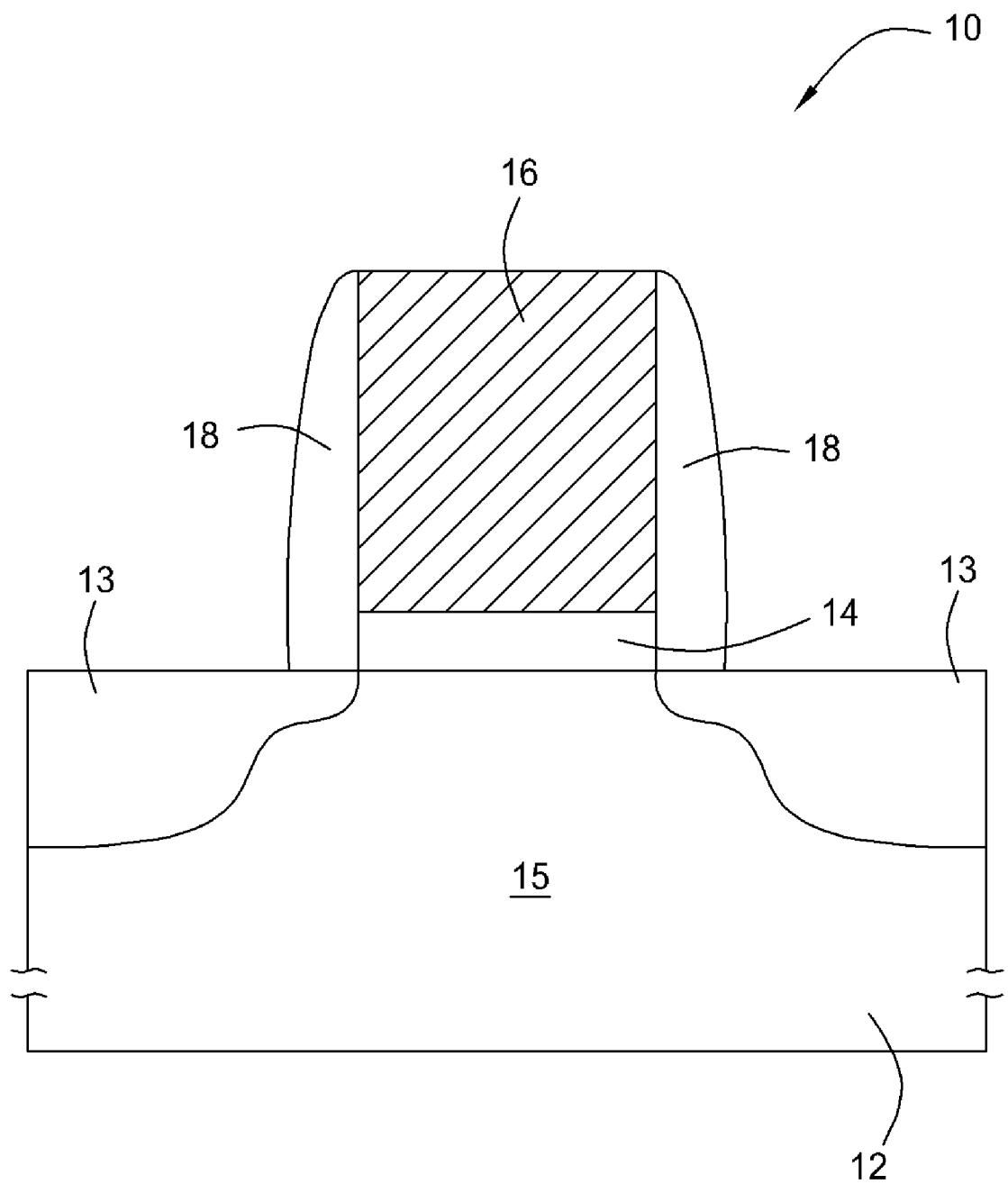
FIG. 1A (prior art) is a schematic cross-sectional view of FET and can be produced in accordance with the present invention.
Figure 1B:
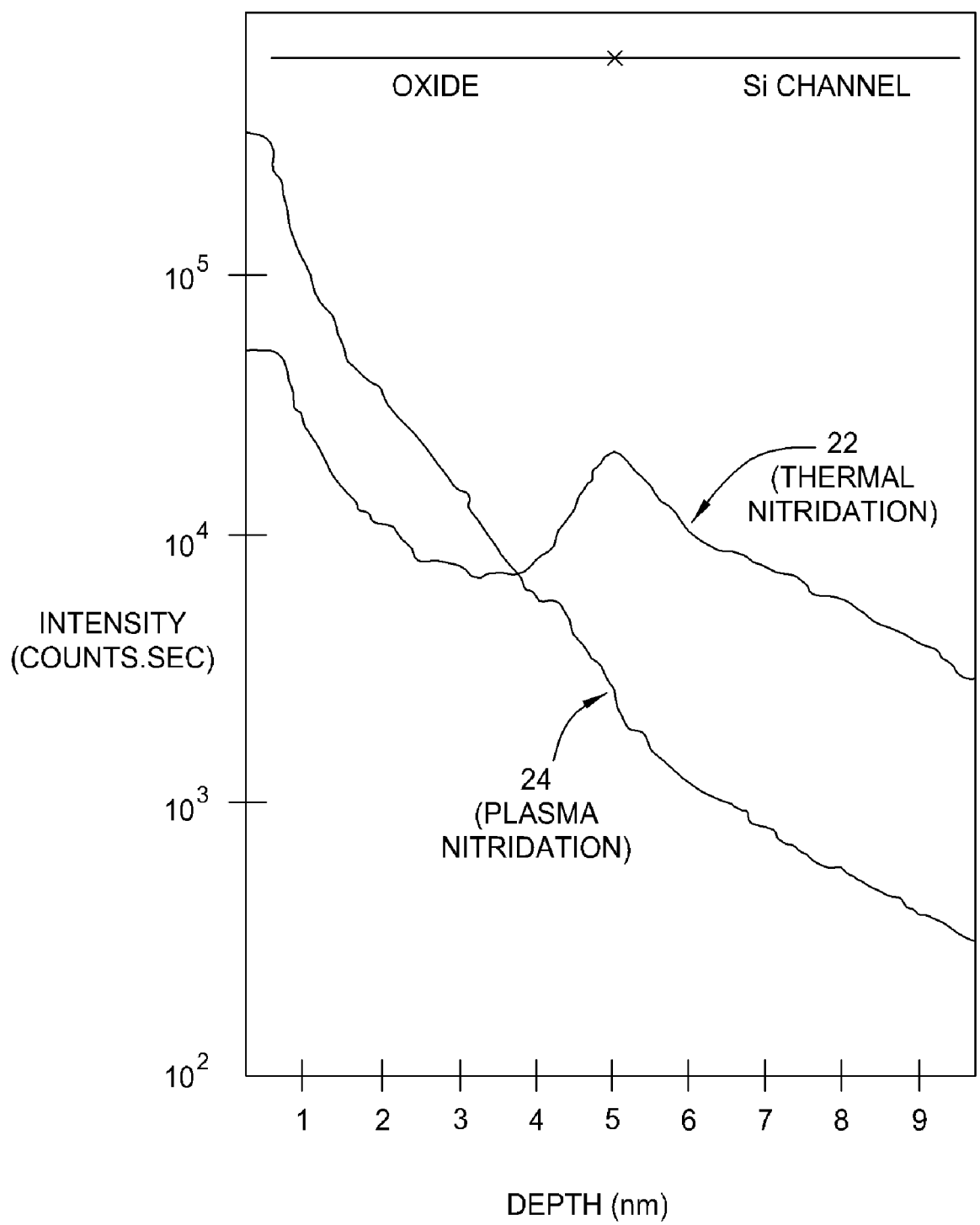
FIG. 1B (prior art) is a graph showing nitrogen concentration profiles, based on secondary ion mass spectroscopy data, for a conventional thermal nitridation process and for a conventional plasma nitridation process.

The present invention generally provides methods and apparatuses that are adapted to form a high quality dielectric gate layer on a substrate. Embodiments contemplate a method wherein a metal plasma treatment process is used in lieu of a standard nitridization process to form a high dielectric constant layer on a substrate. Embodiments further contemplate an apparatus adapted to "implant" metal ions of relatively low energy in order to reduce ion bombardment damage to the gate dielectric layer, such as a silicon dioxide layer, and to avoid incorporation of the metal atoms into the underlying silicon. Embodiments of the invention may be useful in the formation of semiconductor devices, such as logic or memory devices.

Method of Fabricating a High Dielectric Constant Transistor Gate

Current state-of the art device fabrication processes have difficulty in producing a gate dielectric layer that has a 5-10 Å EOT that has a low leakage current. The current state of the art process for 10-16 Å EOT in the 65 nm to 90 nm transistor node uses a plasma nitridation process. However, as the nitrided silicon dioxide gate dielectric layers are scaled to thinner physical thicknesses, for example 10 Å, the gate leakage may increase to a level unacceptable for practical device applications. To resolve the gate leakage issue at smaller dielectric layer thicknesses, the following processes may be used to replace the plasma nitridation process with a deposition process that will form a high-k dielectric oxide or silicate, contain materials, such as hafnium (Hf), lanthanum (La), aluminum (Al), titanium (Ti), zirconium (Zr), strontium (Sr), lead (Pb), yttrium (Y), or barium (Ba).

The present invention contemplates a method for fabricating a gate dielectric in a field effect transistor for logic type applications that have a thin gate dielectric thickness between about 5 and about 10 Angstroms (Å) equivalent (electrical) oxide thickness (EOT). The present invention also contemplates a method for fabricating a gate dielectric layer in a field effect transistor for memory type applications that have a gate dielectric layer that is between about 10 Å and about 30 Å equivalent (electrical) oxide thickness (EOT). This process may be used in the fabrication of integrated semiconductor devices and circuits.

Gate Oxide Layer Formation Method and Apparatus

In an effort to resolve common gate performance issues found in 45 nanometer (nm) and smaller MOS type devices a novel process has been created to reduce and/or eliminate defects, such as Fermi-level pinning or threshold voltage pinning. In general, the process includes the steps of forming a high-k dielectric and then terminating the surface of the deposited high-k material to form a good interface between the gate electrode and the high-k dielectric material. Embodiments of the invention also provide a cluster tool that is adapted to form a high-k dielectric material, terminate the surface of the high-k dielectric material, perform one or more post treatment steps, and form the polysilicon and/or metal gate layers.

Figure 2A:
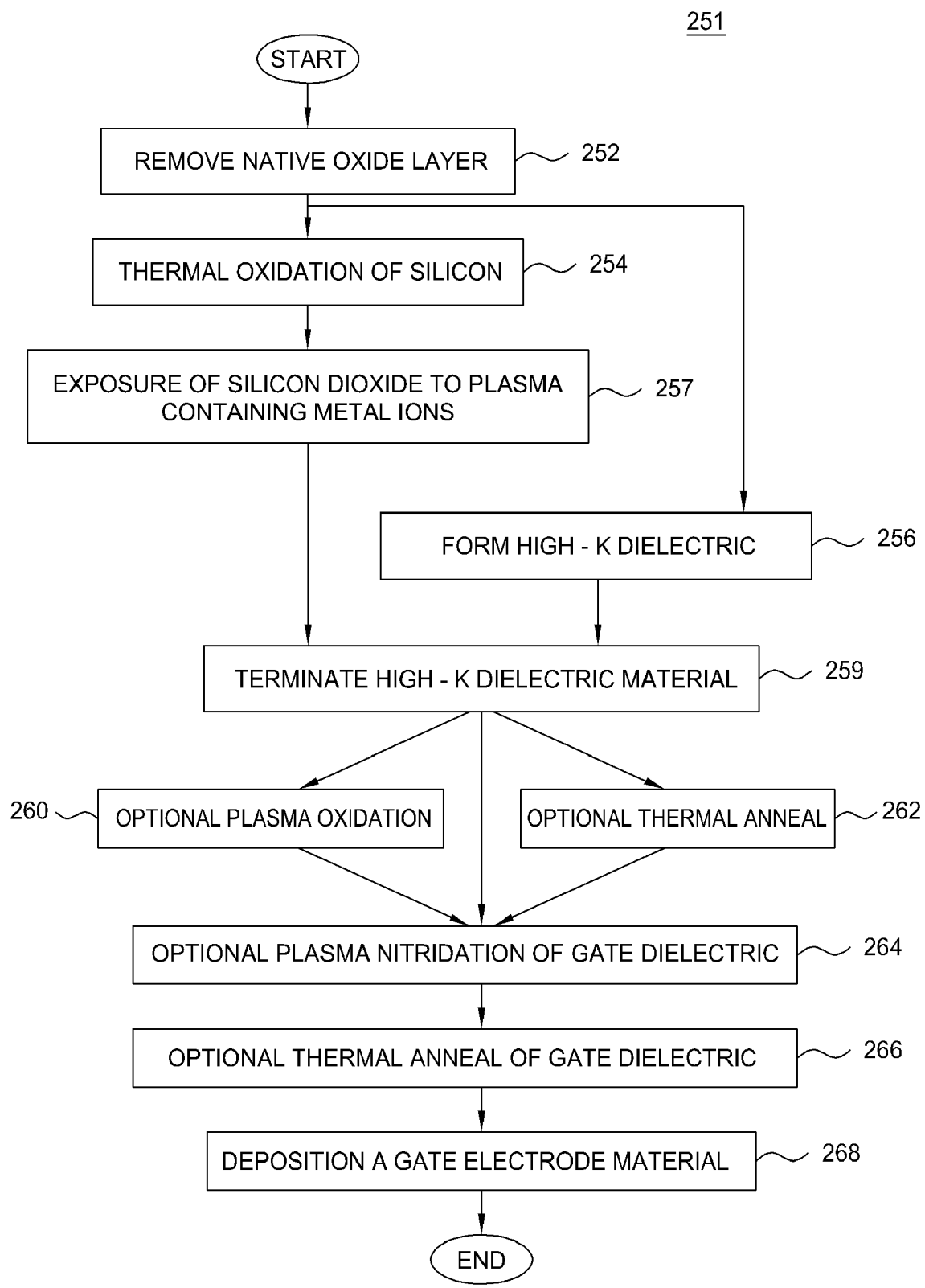
FIG. 2A is a process flow diagram illustrating a method for fabricating a gate dielectric of a field effect transistor in accordance with one embodiment of the present invention.

FIG. 2A illustrates a process sequence 251 that contains a series of method steps that are used to fabricate a gate dielectric of a field effect transistor in accordance with one embodiment of the present invention. The process sequence 251 generally includes processing steps performed upon a substrate to form a gate structure of an exemplary MOS type device. FIGS. 3A-3F illustrate a region of a substrate 401 over which a gate oxide layer and gate are formed using the steps in process sequence 251 shown in FIG. 2A. The images in FIGS. 3A-3F are not depicted to scale and are simplified for illustrative purposes. At least portions of the process sequence 251 may be performed using processing reactors in an integrated semiconductor substrate processing system (i.e., a cluster tool), such as the one shown in FIG. 7.

Figure 7:
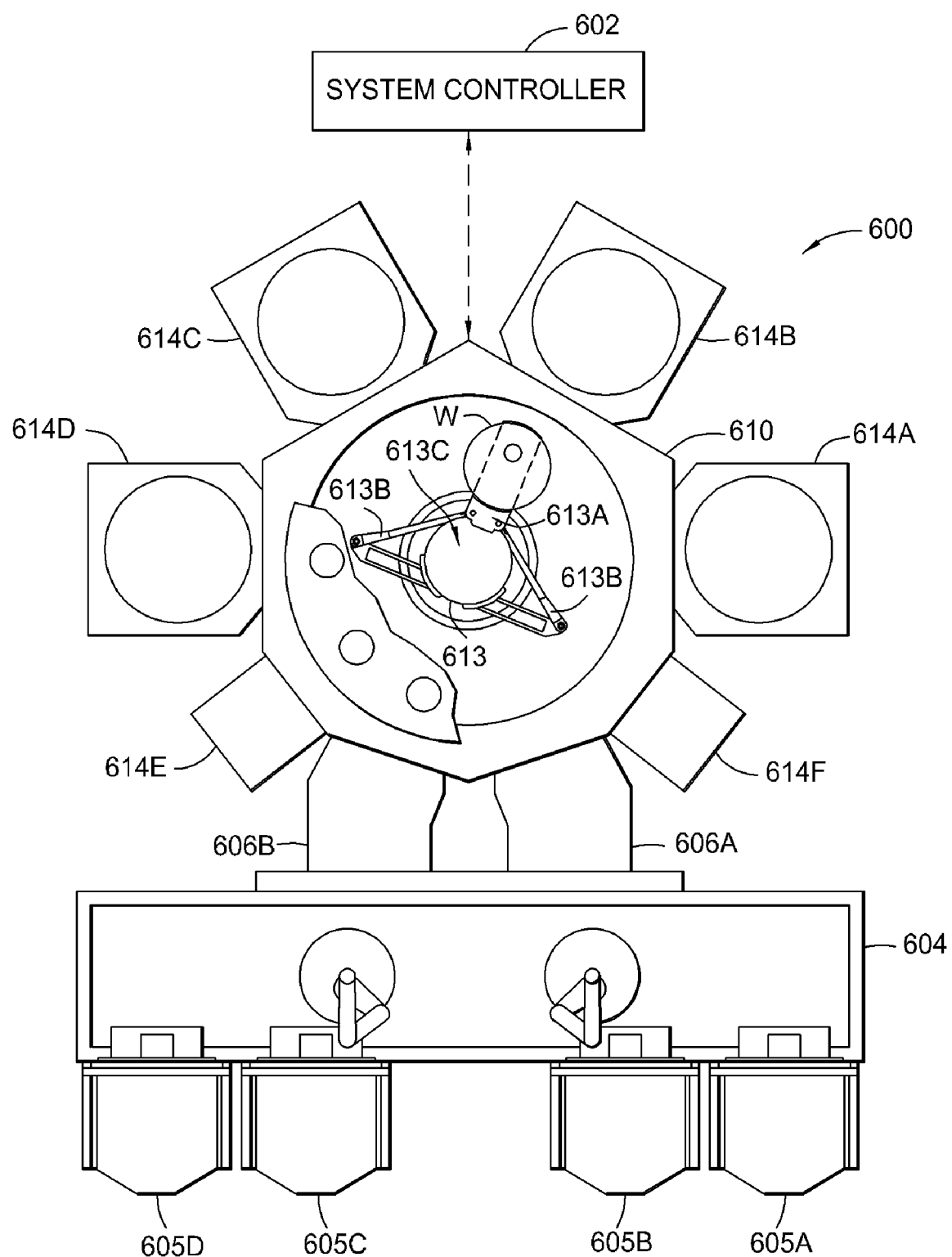
FIG. 7 illustrates an integrated processing system according to one embodiment of the invention.

The process sequence 251 starts at step 252 and proceeds to step 268. At step 252, a silicon (Si) substrate 401 is provided (e.g., 200 mm wafer, 300 mm semiconductor wafer) and exposed to a cleaning solution for removing a native oxide layer 401A (e.g., silicon dioxide ($SiO_2$)) from a surface of the substrate (FIG. 3A). In one embodiment, the native oxide layer 401A is removed using a cleaning solution comprising hydrogen fluoride (HF) and deionized (DI) water. In one embodiment, the cleaning solution is an aqueous solution that contains between about 0.1 and about 10% by weight of HF that is maintained at a temperature between about 20 and about 30° C. In one example, the cleaning solution comprises about 0.5 wt % of HF is maintained at a temperature of about 25° C. During step 252 the substrate 401 can be immersed into the cleaning solution, and then rinsed in de-ionized water. Step 252 may be performed in either a single substrate processing chamber or a multiple substrate batch type processing chamber that may include delivery of ultra-sonic energy during processing. Alternatively, the step 252 may be performed using a single substrate wet cleaning reactor of the integrated processing system 600 (FIG. 7). In another embodiment, the native oxide layer 401A may be removed using an RCA clean method. Upon completion of step 252, the substrate 401 is placed in a vacuum load lock or nitrogen ($N_2$) purged environment. Alternatively, step 252 may be performed using a single substrate wet clean reactor of the integrated processing system 600 (FIG. 7).

At step 254, a thermal oxide ($SiO_2$) layer 402 is grown on the cleaned surface 401B of the substrate 401 (FIG. 3B). Generally, the thermal oxide layer 402 may have a thickness between about 3 and about 35 Angstroms. In logic type applications the thermal oxide layer 402 may have a thickness between about 6 and about 15 Angstroms, while in memory type applications the thermal oxide layer 402 may have a thickness between about 15 and about 40 Angstroms.

Embodiments of the invention may also be used in applications where the thermal oxide layer 402 may have a thickness greater than 35 Angstroms. The thermal oxidation step 254 results in the formation of silicon dioxide ($SiO_2$) sub-layers to form on the silicon dielectric film interface. It is believed that step 254 improves the quality and reliability of the dielectric/silicon interface over dielectric layers that are deposited (e.g., high-k dielectric layer 404 in FIG. 3D), while also increasing the mobility of charge carriers in the channel region below the surface 401B. Step 254 can be performed using, a rapid thermal processing (RTP) reactor positioned in one of the substrate processing chambers 614A-614F in the integrated processing system 600 shown in FIG. 7. One suitable RTP chamber is the RADIANCE® RTP chamber, available from Applied Materials, Inc., of Santa Clara, Calif. In one example, a 6 Å silicon dioxide ($SiO_2$) film is formed on a surface 401B of a substrate 401 using an 18 second, 750° C., 2 Torr process that has a 2 slm flow rate of oxygen ($O_2$) gas. In this example, oxygen is the reactive gas injected into the process chamber during the formation of the thermal oxide layer 402, while in some cases an inert carrier gas may be added to the process chamber to achieve a desired chamber pressure. Alternately, in some cases it may be desirable to use a reactive gas, such as nitric oxide (NO) and nitrous oxide ($N_2O$), or a reactive gas mixture such as hydrogen ($H_2$)/oxygen ($O_2$) and nitrous oxide ($N_2O$)/hydrogen ($H_2$), during step 254.

In step 257, thermal oxide layer 402 is exposed to a metal ion containing plasma that is used to dope the thermal oxide layer with a desirable material to form a high-k dielectric layer 403. The high-k dielectric layer 403, formed in step 257, may be a silicon dioxide layer that is doped with hafnium (Hf), lanthanum (La), or other similar material. In one embodiment, a low energy deposition process is performed using a process chamber similar to the chambers described in reference with FIGS. 4A-4C and FIG. 4F, now referenced below. In one embodiment, it is desirable to deliver the dopant material into the thermal oxide layer 402 by creating a plasma using RF energy delivered to the processing region 522 and then forming a cathodic bias on a target (e.g., reference numerals 505 in FIG. 4A or 571 in FIG. 4B) to sputter material therefrom. In one aspect, it is also desirable to RF bias, DC bias, or ground the substrate support 562 to cause the sputtered and ionized material to implant a desired range of depths within the thermal oxide layer 402. In another aspect, it is desirable to allow the substrate support 562 to electrically "float" so that the voltage created between the substrate support 562 relative to the plasma, due to the generation of a self bias, is low to reduce the energy of the ionized material striking the thermal oxide layer 402. Various methods of delivering low energy material to dope the thermal oxide layer 402 are discussed below in conjunction with FIGS. 4A-4F and FIGS. 5A-5C. By careful control of the chamber pressure, RF power, pulsed DC power, bias applied to the substrate support 562 and/or the processing time, the amount of dopant and the concentration versus depth of the dopant material in the thermal oxide layer 402 can be controlled. In one embodiment, the plasma may contain argon ions and a metal ion, such as hafnium hafnium, lanthanum, aluminum, titanium, zirconium, strontium, lead, yttrium, and barium, as well as may contain one or more optional inert gases. Typical inert gases may include neon (Ne), helium (He), krypton (Kr), xenon (Xe), nitrogen ($N_2$), and the like. In one example, the thermal oxide layer 402 is doped with between about 5 and about 30 atomic percent (atomic %) of hafnium (Hf). It is generally desirable to reduce the dopant concentration in the thermal oxide layer 402 so that it tails off to near zero at or at least a few Angstroms before the interface between thermal oxide layer 402 and silicon channel surface (e.g., surface 401B). In one example, when using an inductively coupled version of the processing chamber (reference numeral 500 in FIG. 4A) a 10 atomic % (average) concentration of hafnium (Hf) is disposed within the thermal oxide layer 402 using a 180 second and 10 mTorr chamber pressure process (e.g., primarily argon gas) that applies –150 VDC to a hafnium target (reference numeral 505) and delivers RF energy to a coil (reference numeral 509) at a frequency of 13.56 MHz and a power of 50 Watts using a 5% duty cycle using a "floating" substrate pedestal. In another example, when using a process configuration similar to the one shown in FIG. 4G a 7 atomic % concentration of hafnium (Hf) (average) is disposed within the thermal oxide layer 402 using a 180 second and 10 mTorr chamber pressure process (e.g., primarily argon gas) that applies about a 100 watt average RF power (i.e., ~5% duty cycle and ~2000 W peak RF power) to a hafnium containing target 505 and applies about a 100 Watt average RF power (i.e., ~5% duty cycle and ~2000 W peak RF power) to the coil 509 at a frequency of 13.56 MHz using a "floating" substrate pedestal. In one embodiment, to prevent damage to the thermal oxide layer 402 during step 257 the average RF power is held to a level less than about 1000 W. In another embodiment, the average RF power used during step 257 is less than about 200 W. In yet another embodiment, the average RF power used during step 257 is less than about 50 W. In one embodiment, step 257 is performed using, a low energy plasma processing chamber (e.g., processing chamber 500 or process chamber 501) positioned in one of the substrate processing chambers 614A-614F in the integrated processing system 600 shown in FIG. 7.

In one embodiment, as illustrated in FIGS. 2A and 3D, instead of forming a high-k dielectric layer 403 from the thermal oxide layer 402 using steps 254 and 257, an alternate step 256 may be performed to deposit a high-k dielectric layer 404 on the surface 401B of the substrate 401 using a metal organic chemical vapor deposition (MoCVD) process, atomic layer deposition (ALD) process or other similar deposition process. The high-k dielectric layer 404 may contain, but is not limited to zirconium oxide ($ZrO_2$), hafnium oxide ($Hf_xO_y$), hafnium silicate oxides ($Hf_xSi_{1-x}O_y$), lanthanum oxides ($La_2O_3$), and/or aluminum oxide ($Al_2O_3$). Step 256 can be performed using an atomic layer deposition system, for example, a Centura ALD High-K system available from Applied Materials Inc. An ALD type reactor may also be positioned in one of the substrate processing chambers 614A-614F in the integrated processing system 600 shown in FIG. 7.

In step 259, the surface of the high-k dielectric layer 403, or the high-k dielectric layer 404, is terminated by performing a plasma deposition process to form a terminating region 405. In general the terminating region 405 is formed by either depositing a layer material and/or doping a region of the high-k dielectric layer 403, or the high-k dielectric layer 404. It is believed that the addition of a terminating region 405 that contains a passivating material, such as lanthanum oxide ($La_2O_3$) or aluminum oxide ($Al_2O_3$) will passivate the surface and resolve the Fermi-level pinning or threshold voltage shift, problems commonly found in conventional ALD or MoCVD high-k films. In one embodiment, the high-k dielectric layer 403, or the high-k dielectric layer 404, is doped with between about 0.1 and about 10 atomic % of lanthanum (La) and/or between about 0.1 and about 10 atomic % of aluminum (Al). In another embodiment, the high-k dielectric layer 403, or the high-k dielectric layer 404, is doped with between about 0.25 and about 5 atomic % of lanthanum (La) and/or between about 1 and about 10 atomic % of aluminum (Al). It is believed that it is desirable to reduce the dopant concentration in the high-k dielectric layer 403, or the high-k dielectric layer 404, so that it only extends a few Angstroms within the high-k dielectric layer 403, or the high-k dielectric layer 404. In one embodiment, a lanthanum (La) dopant is driven into the high-k dielectric layer 403 using the process chambers discussed below in FIGS. 4A-4C. In one example, a 0.5 atomic % (average) concentration of lanthanum (La) is driven into a 10 atomic % hafnium doped high-k dielectric layer 403 using a 120 second and 10 mTorr chamber pressure process (e.g., primarily argon gas) that applies −100 VDC to a lanthanum target (e.g., reference numeral 505 in FIG. 4A) and delivers RF energy to a coil (e.g., reference numeral 509 FIG. 4A) at a frequency of 13.56 MHz and a power of 50 Watts using a 5% duty cycle using a "floating" substrate pedestal.

Figure 4A:
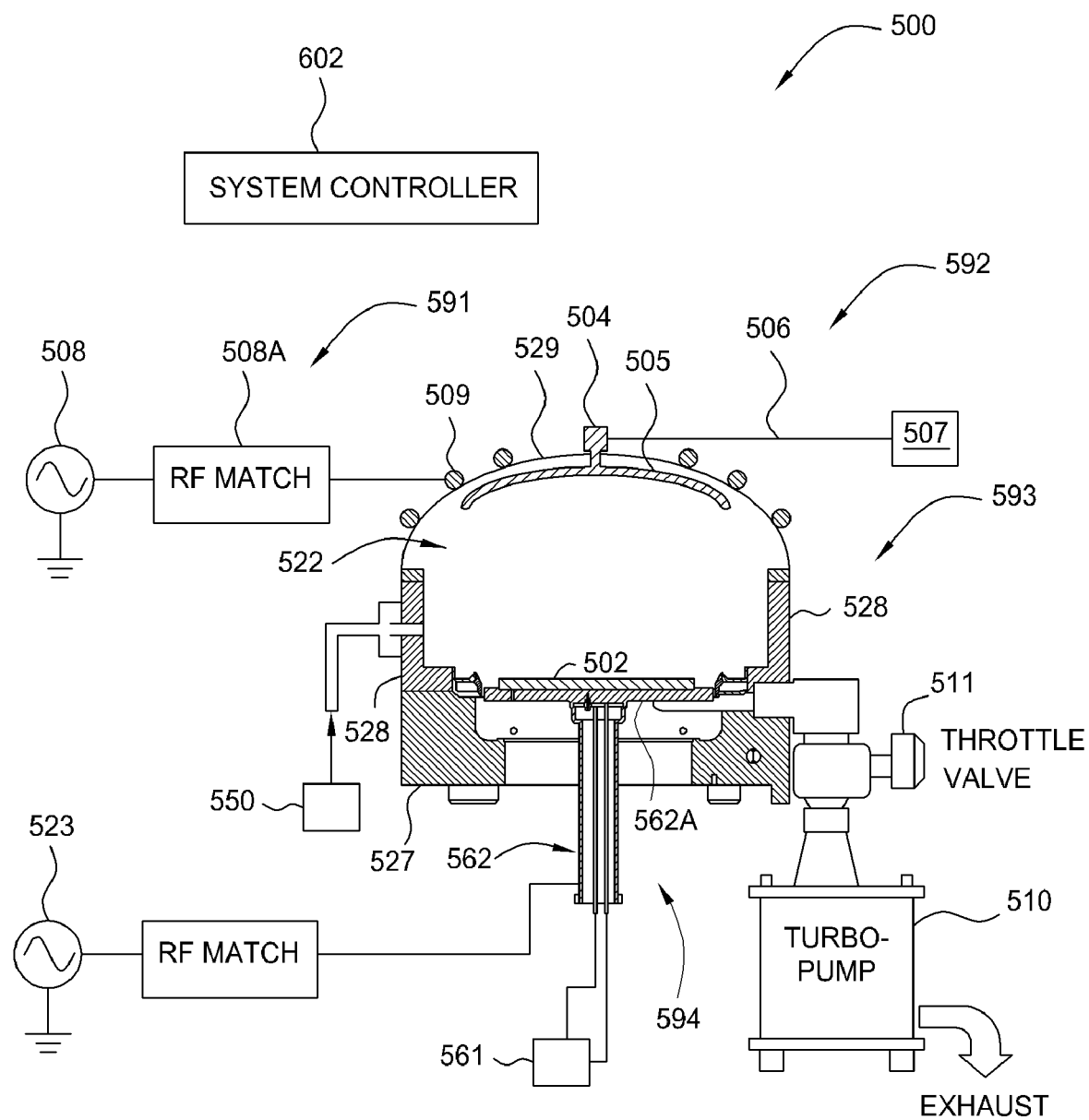
FIG. 4A illustrates a schematic cross-sectional view of a plasma treatment chamber according to another embodiment of the invention.
Figure 4B:
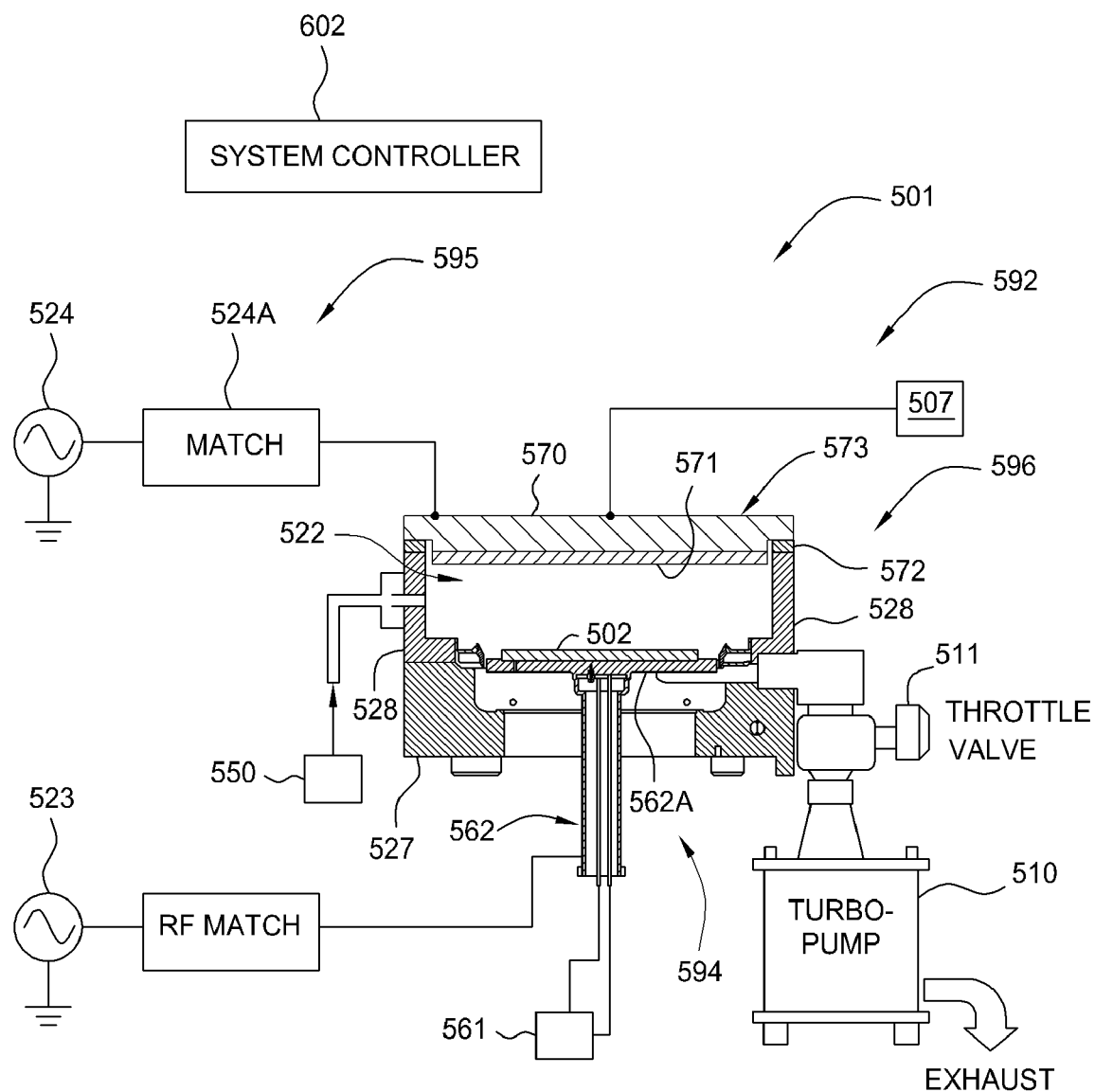
FIG. 4B illustrates a schematic cross-sectional view of a plasma treatment chamber according to another embodiment of the invention.
Figure 4C:
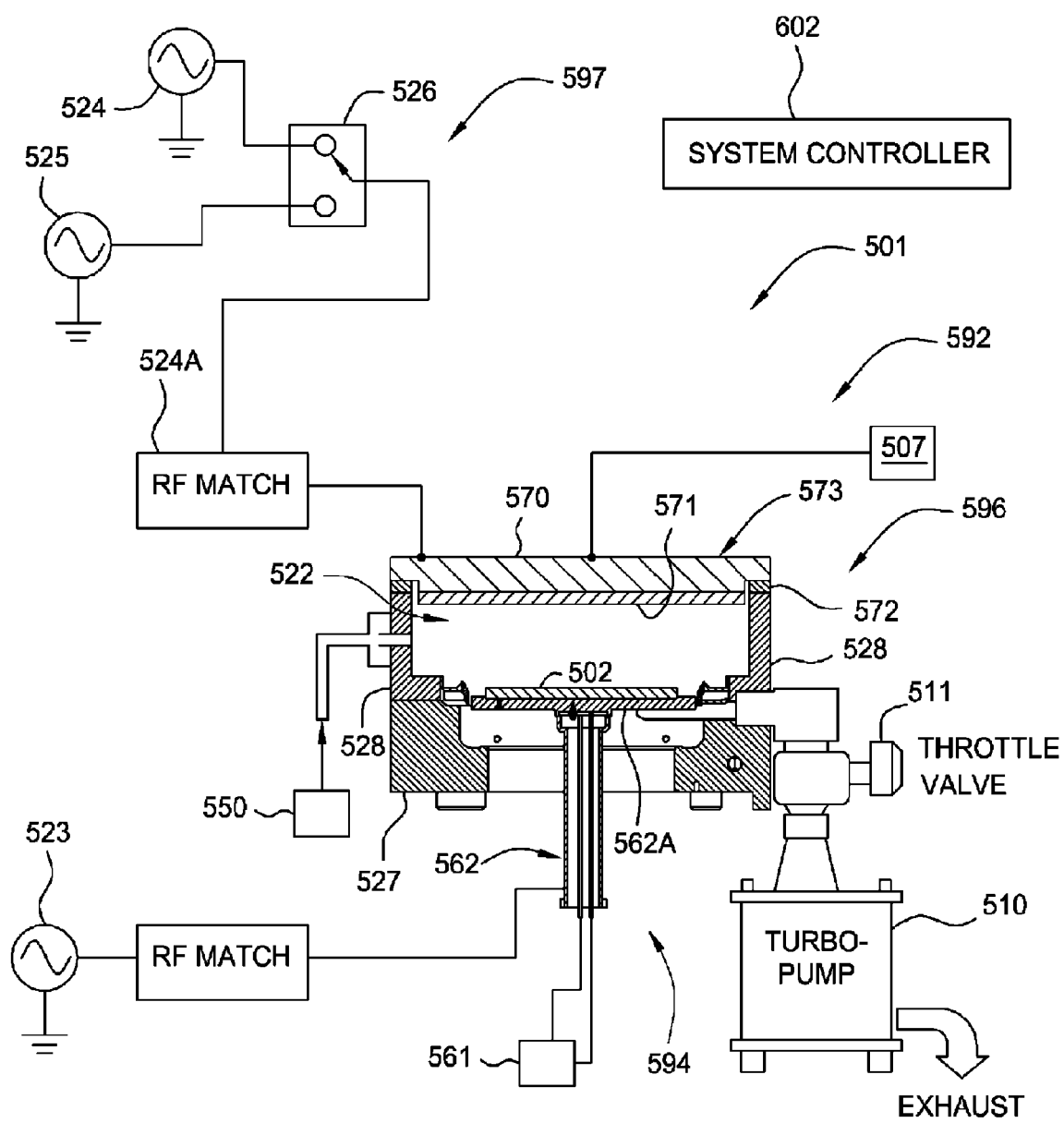
FIG. 4C illustrates a schematic cross-sectional view of a plasma treatment chamber according to one embodiment of the invention.

In one embodiment, the step 259 may be performed in a process chamber similar to a process chamber 500 or a process chamber 501 illustrated in FIGS. 4A-4C. In this configuration the terminating region 405 is formed by performing a low energy implant type process, similar to the process described above in step 257. In one aspect, the dopant material is delivered into the upper most region of the high-k dielectric layer 403 by creating a plasma using RF energy delivered to the processing region 522 and then forming a cathodic bias on the target 505 to sputter material therefrom. The substrate support 562 may be RF biased, DC biased, grounded, or float to cause the sputtered and ionized material to implant into the high-k dielectric layer 403. Various methods of delivering low energy material to dope the high-k dielectric layer 403 are discussed below in conjunction with FIGS. 4A-4F and FIGS. 5A-5C, below. Therefore, by careful control of the chamber pressure, RF power, pulsed DC bias, optional bias applied to the substrate support 562 and/or the processing time, the amount of dopant and concentration versus depth of the dopant material in the high-k dielectric layer 403 can be controlled. In one embodiment, the dopant is an aluminum containing material, a lanthanum containing material, or other similar material.

In one embodiment, step 259 may be performed using a processing chamber 500 positioned in one of the substrate processing chambers 614A-614F in the integrated processing system 600 shown in FIG. 7. In one aspect, the processing chamber 500 used to perform step 259 is a different processing chamber than the processing chamber used to perform step 257. In another embodiment, a single processing chamber 500 that is attached to the integrated processing system 600 is used to perform steps 257 and 259, but each step is performed using a different target material that are disposed within the processing region 522 of the processing chamber 500.

In another embodiment of step 259, the terminating region 405 may be an additional layer of material that is deposited on the surface of the high-k dielectric layer 403 by performing a sputtering process. In one aspect, the sputtering process is performed using a process chamber similar to a process chamber 500 or a process chamber 501 illustrated in FIGS. 4A-4C. In this configuration the terminating region 405 is formed by depositing the target material on top of the high-k dielectric layer 403 by creating a plasma using RF energy delivered to the processing region 522 and then forming a cathodic bias on the target 505 to sputter material therefrom. The substrate support 562 may be RF biased, grounded, or electrically float to control the energy and depth of the sputtered and ionized material that will implant into the high-k dielectric layer 403. In one embodiment, the deposited layer contains aluminum (Al), lanthanum (La), or other suitable materials.

In one embodiment, the optional step 260 utilizes an oxygen containing RF plasma to oxidize the exposed materials to convert them into a dielectric material. In one example, the high-k dielectric layer 403, the high-k dielectric layer 404 and/or terminating region 405 are exposed to an oxygen containing plasma to form an aluminum oxide or a lanthanum oxide. In another embodiment, the plasma contains nitrogen ($N_2$), and may also contain one or more oxidizing gas, such as $O_2$, NO, $N_2O$. The plasma may also contain one or more optional inert gases, such as argon (Ar), and helium (He). Step 260 can be performed using, for example, a decoupled plasma nitridation (DPN) plasma reactor of the integrated processing system 600 (FIG. 7). In one embodiment, a thermal oxidation step is used instead of a plasma oxidation step to oxidize the exposed material to convert it into a dielectric material. In one example, the plasma oxidation process is performed using a 5% duty cycle and 1000 W peak power (i.e., 50 W average power) at RF frequency of 13.56 MHz for 30 seconds using a nitrogen flow rate of about 100 sccm and a oxygen flow rate of about 100 sccm to oxidize the exposed materials.

In an alternative embodiment, the optional step 262 is used in place of step 260. In step 262, the high-k dielectric layer 403, or the high-k dielectric layer 404, and substrate 401 are annealed at a temperature between about 600° C. and about 1100° C. A lower temperature anneal such as anneal performed at a temperature between about 600° C. and about 800° C. may be advantageously used to prevent the crystallization of a prior deposited material, such as hafnium with silicon (Si), oxygen ($O_2$), or both. Step 262 can be performed using, a suitable thermal annealing chamber, such as a RADIANCE® or RTP $XE^+$ reactor of the integrated processing system 600, or either a single substrate or batch furnace. The step 262 results in the formation of silicate sub-layers within the high-k dielectric layer 403 or terminating region 405. In one embodiment, the step 262 may performed by providing at least one of oxygen ($O_2$) between about 2 and about 5000 sccm and nitric oxide (NO) between about 100 and about 5000 sccm, either gas optionally mixed with nitrogen ($N_2$), while maintaining a substrate surface temperature between about 600 and about 1100° C., and a pressure in the process chamber between about 0.1 and about 50 Torr. The process may be performed for about 5-180 seconds. In one example, step 262 is a 15 second, 900° C., 1 Torr process that has a 60 sccm flow rate of oxygen ($O_2$) gas and a 940 sccm flow rate of nitrogen ($N_2$) gas. In another example, $O_2$ is provided at about 200 sccm (e.g., about 200 mT partial pressure of oxygen) and nitrogen ($N_2$) is provided at about 800 sccm while maintaining the process chamber at a temperature of about 1000° C. and a pressure of about 1 Torr, for a duration of about 15 seconds. In another yet example, NO is provided at about 500 sccm, while maintaining the chamber at a substrate temperature of about 1000° C. and a pressure of about 0.5 Torr, for duration of about 15 seconds.

In one embodiment, neither steps 260 or 262 are performed after performing either of the steps 256, 257, or 259. In one embodiment of process sequence 251, an oxidation step, similar to step 260 or step 262, may be preformed in between steps 257 and 259 to re-oxidize the dopant material deposited in step 257 before the terminating region 405 is deposited over the high-k dielectric layer 403.

At step 264 the terminating region 405 and high-k dielectric layer 403, or the high-k dielectric layer 404, are treated in a nitrogen plasma to enhance the amount of nitrogen in these areas. The process may be formed using a DPN reactor by providing nitrogen (N$_2$) between about 10 and about 2000 sccm, a substrate pedestal temperature between about 20 and about 500° C., and a pressure in the reaction chamber between about 5 and about 200 mTorr. The radio-frequency (RF) plasma is energized, for example at 13.56 MHz or 60 MHz, using either a continuous wave (CW) or pulsed plasma power source of up to about 3 to 5 kW. During pulsing, peak RF power, frequency and a duty cycle are typically selected in the ranges between about 10 and about 3000 W, about 10 kHz, and about 2 and about 100%, respectively. This process may be performed for about 1 second to about 180 seconds. In one example, N$_2$ is provided at about 200 sccm, and about 1000 W of peak RF power is pulsed at about 10 kHz with a duty cycle of about 5% applied to an inductive plasma source, at a temperature of about 25° C. and a pressure between about 10 and about 80 mTorr, for about 15 sec. to about 180 sec. The plasma may be produced using a quasi-remote plasma source, an inductive plasma source, or a radial line slotted antenna (RLSA) source, among other plasma sources. In alternate embodiments, sources of CW and/or pulsed microwave power may be used to form a region that has a high nitrogen content.

At step 266, the substrate 401 may be annealed to reduce the leakage current between the layers formed on the substrate 401 and increases mobility of charge carriers in the channel region below the surface 401B, as well as improve the reliability of the formed device. Step 266 can help to reduce the number of defects in the layers formed on the substrate 401. It is believed that the act of annealing, or passivating, the nitrided layer formed in step 264 during step 266 will also help promote the formation of an effective barrier to the diffusion of boron from a boron doped polysilicon gate electrode. Step 266 can be performed using, a suitable thermal annealing chamber, such as a RADIANCE® or RTP XE$^+$ reactor of the integrated processing system 600, or either a single substrate or batch furnace. In one embodiment, the annealing process of step 266 may performed by providing at least one of oxygen (O$_2$) at a flow rate between about 2 and about 5000 sccm and nitric oxide (NO) at a flow rate between about 100 and about 5000 sccm, either gas optionally mixed with nitrogen (N$_2$), while maintaining a substrate surface temperature between about 800 and about 1100° C., and a pressure in the reaction chamber between about 0.1 and about 50 Torr. The process may be performed for about 5-180 seconds. In one embodiment, oxygen (O$_2$) gas is provided at about 500 sccm while maintaining the chamber at a temperature of about 1000° C. and a pressure of about 0.1 Torr, for a duration of about 15 seconds. In one embodiment, step 266 uses a similar process recipe to the one used in step 262, discussed above.

Upon completion of steps 260, 262, 264, or 266, one or more layers are deposited over the formed layers to form the gate region, or gate electrode, of a formed MOS device using step 268. In one embodiment of step 268, a polysilicon layer is deposited in the gate region over the layers described above to provide a gate electrode. In one example, a polysilicon layer is deposited using a conventional polysilicon deposition process. In one embodiment, a polysilicon deposition chamber (not shown) is part of the integrated processing system 600. In one embodiment, polysilicon is deposited over the layers formed during the process sequence 251 using an CVD or ALD reactor, such as a Centura CVD reactor available from Applied Materials Inc., which comprises one of the substrate processing chambers 614A-614F in the integrated processing system 600 shown in FIG. 7.

In another embodiment of step 268, as shown in FIG. 3F, the gate region 408 contains multiple conductive layers, such as a thin metal layer 407 and a polysilicon layer 406. In one embodiment, the gate region 408 contains a thin metal layer 407 that is deposited over the layers formed during the process sequence 251 to provide a gate material that has a higher carrier concentration than traditional polysilicon gate materials. The thin metal layer 407 may have a thickness between about 5 and about 200 angstroms (Å), and more preferably less than about 30 Å. In one embodiment, the thin metal layer 407 contains a metal such as tantalum (Ta), tantalum nitride (TaN), tantalum carbide (TaC), tungsten (W), tungsten nitride (WN), tantalum silicon nitride (TaSiN), hafnium (Hf), aluminum (Al), ruthenium (Ru), cobalt (Co), titanium (Ti), nickel (Ni), titanium aluminum nitride (TiAlN), ruthenium nitride (RuN), hafnium nitride (HfN), nickel silicide (NiSi), titanium nitride (TiN) or other suitable material. The thin metal layer 407 may be advantageously formed using the process chamber 500 (FIG. 4A) or process chamber 501 (FIG. 4B-4C) that is attached to the integrated processing system 600 shown in FIG. 7. In this configuration the thin metal layer 407 is formed by depositing the target material over the layers formed during the process sequence 251 by creating a plasma using RF energy and biasing the target to sputter a metal there from, and then optionally biasing the substrate support 562 (FIGS. 4A-4B) to cause the sputtered and ionized metal material to deposit over the previously formed layers. The use of the RF energy to drive the sputter deposition process very allows small amounts of material to be reliably deposited on the substrate surface. Conversely, conventional physical vapor deposition, or sputtering, techniques are severely limited in their ability to reliably deposit small layers of material since the applied sputtering (DC) voltage required to lower the deposition rate to a low enough level to form a thin metal layer will generally not sustain the sputtering plasma. In other embodiments, the thin metal layer 407 may be formed using a conventional CVD, PECVD or ALD process.

Figure 2B:
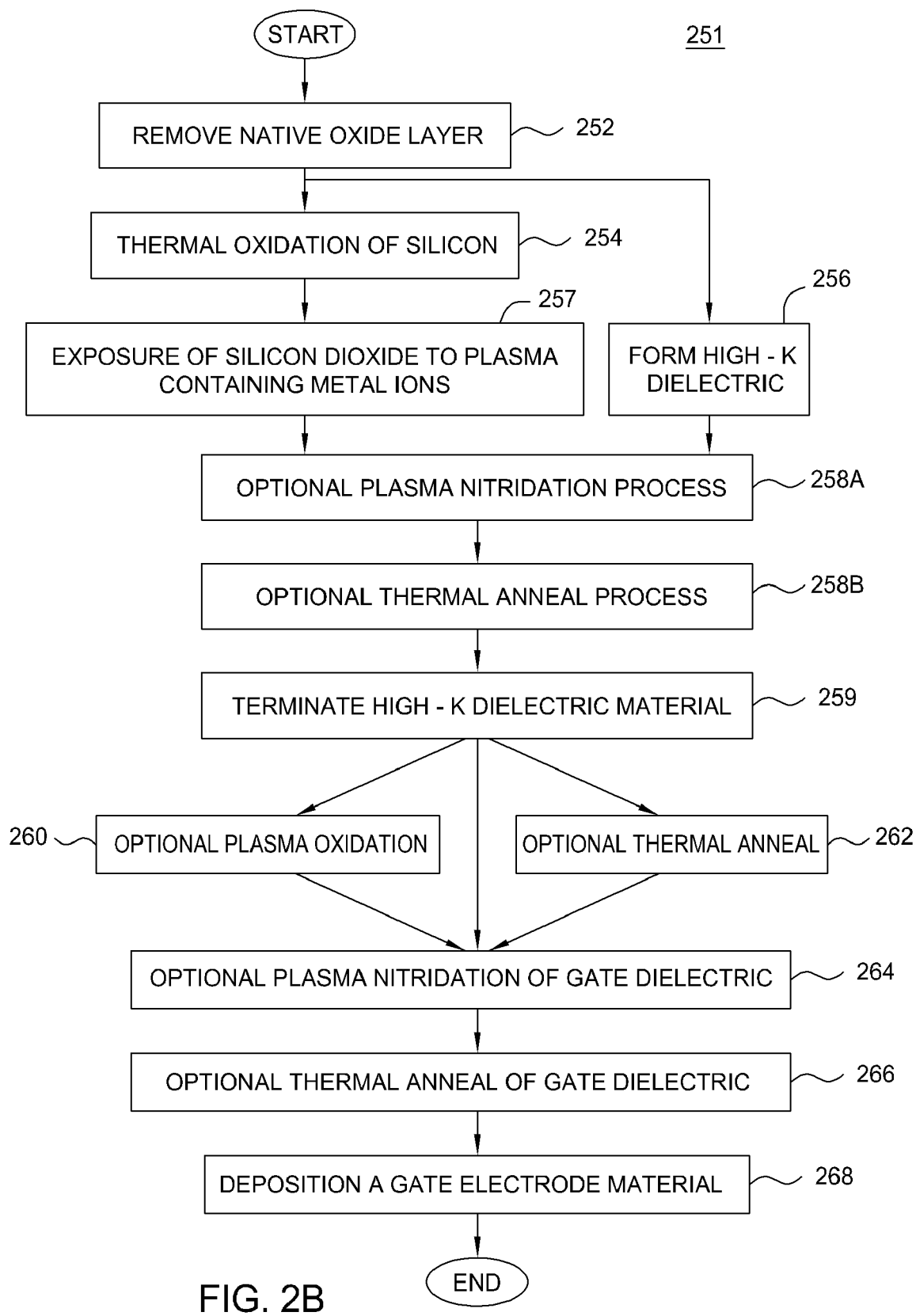
FIG. 2B is a process flow diagram illustrating a method for fabricating a gate dielectric of a field effect transistor in accordance with one embodiment of the present invention.

FIG. 2B illustrates another embodiment of the process sequence 251. The process sequence 251 illustrated in FIG. 2B are the same as the method steps illustrated in FIG. 2A except that at least one of the two optional steps 258A and/or 258B are added between the step 257, or step 256, and step 259. In one embodiment, a plasma nitridation step is added to the process sequence 251 to nitride one or more of the materials found in the high-k dielectric layer 403, or the high-k dielectric layer 404, formed during one of the steps 254, 256 or 257. In one example, it is desirable to form a hafnium nitride containing layer using the plasma nitridation process to prevent the crystallization of a hafnium material found in the high-k dielectric layer 403, or the high-k dielectric layer 404, during a subsequent annealing step, such as steps 258B, 262, or 266. In one embodiment, step 258A is performed using the processes discussed herein in conjunction with step 264.

In one embodiment, an optional thermal annealing step, step 258B, is added to the process sequence 251 to reduce the defects and stress in the formed high-k dielectric layer 403, or the high-k dielectric layer 404 to improve the reliability of the formed device. In one embodiment, step 258B is performed using the processes discussed herein in conjunction with step 262 and/or step 266. In one embodiment, the step 258B is completed after performing step 258A discussed above. In one example, step 258B is a 15 second, 900° C., 1 Torr process that has a 60 sccm flow rate of oxygen (O$_2$) gas and a 940 sccm flow rate of nitrogen (N$_2$) gas.

Figure 2C:
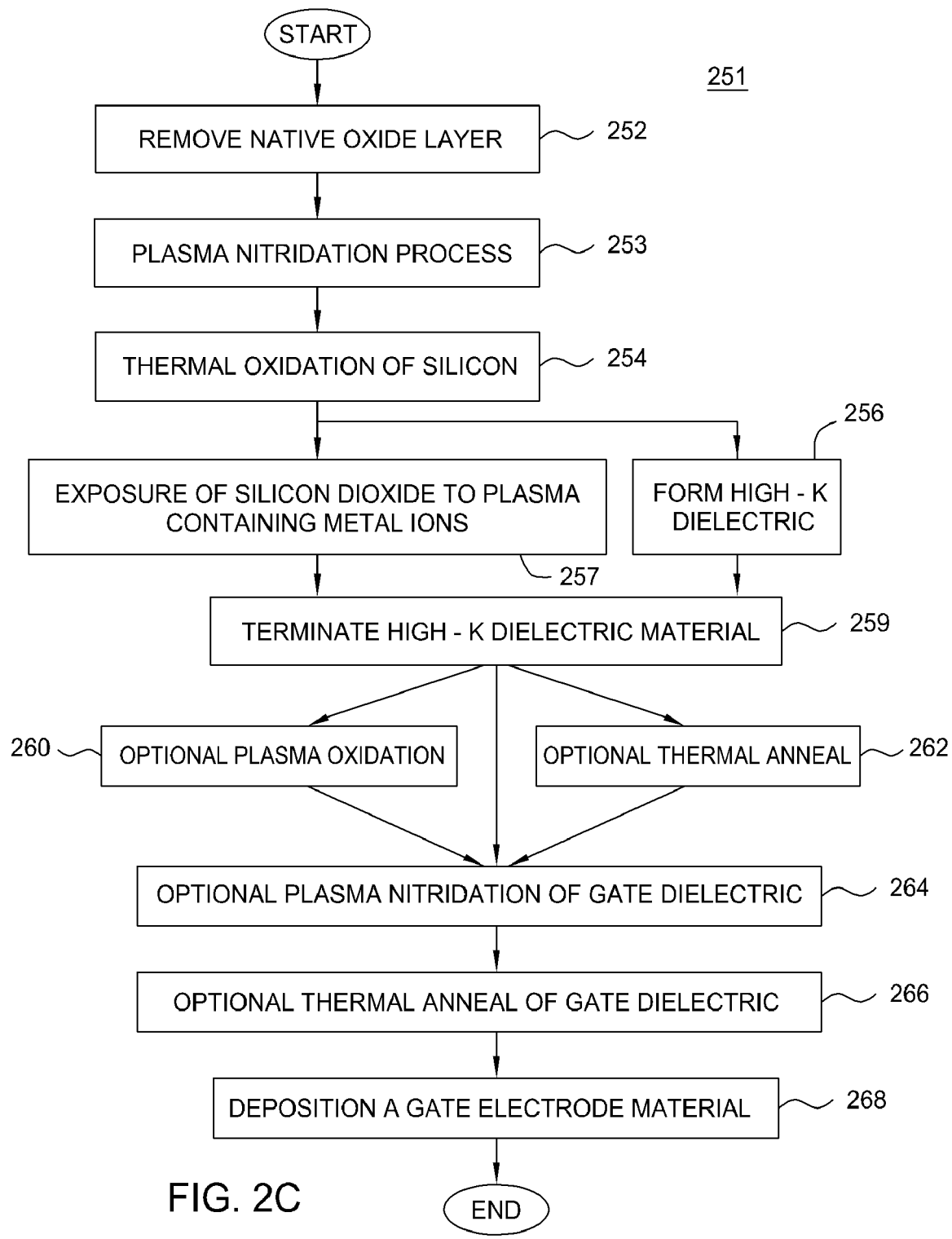
FIG. 2C is a process flow diagram illustrating a method for fabricating a gate dielectric of a field effect transistor in accordance with one embodiment of the present invention.

FIG. 2C illustrates another embodiment of the process sequence 251. The process sequence 251 illustrated in FIG. 2C are the same as the steps illustrated in FIG. 2A except that the step 253 is added between the steps 252 and 254 and step 256 is performed after step 254. In this embodiment, a plasma nitridation step, step 253, is added to the process sequence 251 after removing the native oxide layer in step 252 to nitride the surface of the substrate prior to performing steps 254 or 256. A nitrided silicon substrate surface is believed to help form a desirable silicon oxynitride (SiON) layer that remains at or near the surface of the silicon oxide layer formed during the subsequent thermal oxidation step (step 254). The formation of the SiON layer that remains at or near the surface of the formed silicon dioxide layer may help minimize the diffusion of the gate electrode material (step 268) into the gate dielectric layer during subsequent processing steps. The order that steps 256 and 254 are performed in this embodiment has been changed to allow a silicon oxynitride (SiON) interfacial layer to be formed prior depositing the high-k dielectric layer using steps 256, which will help to improve the characteristics of the interface between the high-k dielectric layer and the channel region of the device. Step 253 may be performed in a DPN reactor that is available from Applied Materials Inc., Santa Clara, Calif. In one example, step 253 utilizes a 10 second, 70 mTorr process using a 25 W average RF power (5% duty cycle at 500 W peak RF power), a gas flow of 200 sccm of $N_2$, and a substrate temperature of about 25° C. Also, in one embodiment of the process sequence 251, step 254 is altered to assure the desirable attributes of the nitrided silicon surface performed in step 253 are retained. In this case it may be desirable to also inject another reactive gas, such as nitrogen ($N_2$), along with oxygen into the process chamber during step 254 to assure a high quality dielectric film is formed. In one example, a silicon oxynitride (SiON) film is formed on the surface 401B using a 30 second, 1050° C., 5 Torr (i.e., 15 mT partial pressure $O_2$) process that has a 15 sccm flow rate of oxygen ($O_2$) gas, and a 5 slm flow rate of nitrogen ($N_2$) gas that is followed by a modified gas setting of a 0.5 slm flow rate of oxygen ($O_2$) gas and a 4.5 slm flow rate of nitrogen ($N_2$) gas for 15 seconds.

Figure 2D:
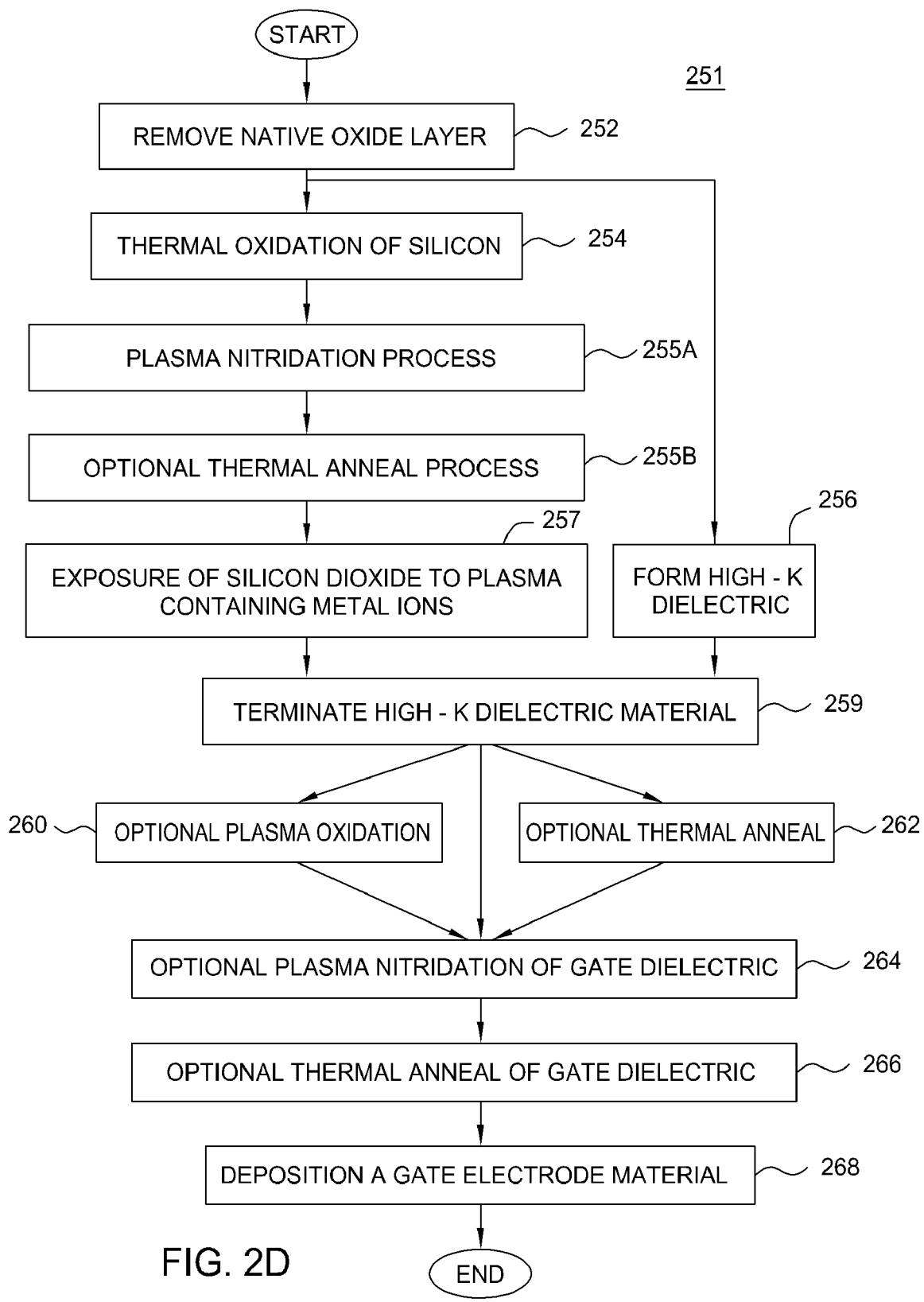
FIG. 2D is a process flow diagram illustrating a method for fabricating a gate dielectric of a field effect transistor in accordance with one embodiment of the present invention.

FIG. 2D illustrates another embodiment of the process sequence 251. The process sequence 251 illustrated in FIG. 2D are the same as the steps illustrated in FIG. 2A except that the two optional step 255A or step 255B may be added between the steps 254 and 257. In one embodiment, an optional plasma nitridation step, step 255A, is added between steps 254 and step 257 to nitride the top surface of the thermal oxide layer formed during steps 254 to form a SiON layer. A SiON layer may act as a diffusion barrier to prevent gate electrode material from diffusing into the gate dielectric layer. In one example, step 255A utilizes a 30 second, 10 mTorr process using a 50 W average RF power (5% duty cycle at 1000 W peak RF power), a gas flow of 200 sccm of $N_2$, and a substrate temperature of about 25° C.

Referring to FIG. 2D, in one embodiment, an optional thermal annealing step, step 255B, is added to the process sequence 251 to reduce the defects and stress in the formed high-k dielectric layer 403 to improve the reliability of the formed device. In one example, the annealing process of step 255B may performed by providing at least one of oxygen ($O_2$) at a flow rate of about 15 sccm and nitrogen ($N_2$) at a flow rate of about 500 sccm, while maintaining a substrate surface temperature of about 1050° C., and a pressure in the reaction chamber between about 1 to 5 Torr. In another embodiment, step 255B is performed using the processes discussed herein in conjunction with step 262 and/or step 266. In one embodiment, the step 255B is completed after performing step 255A discussed above.

Figure 2E:
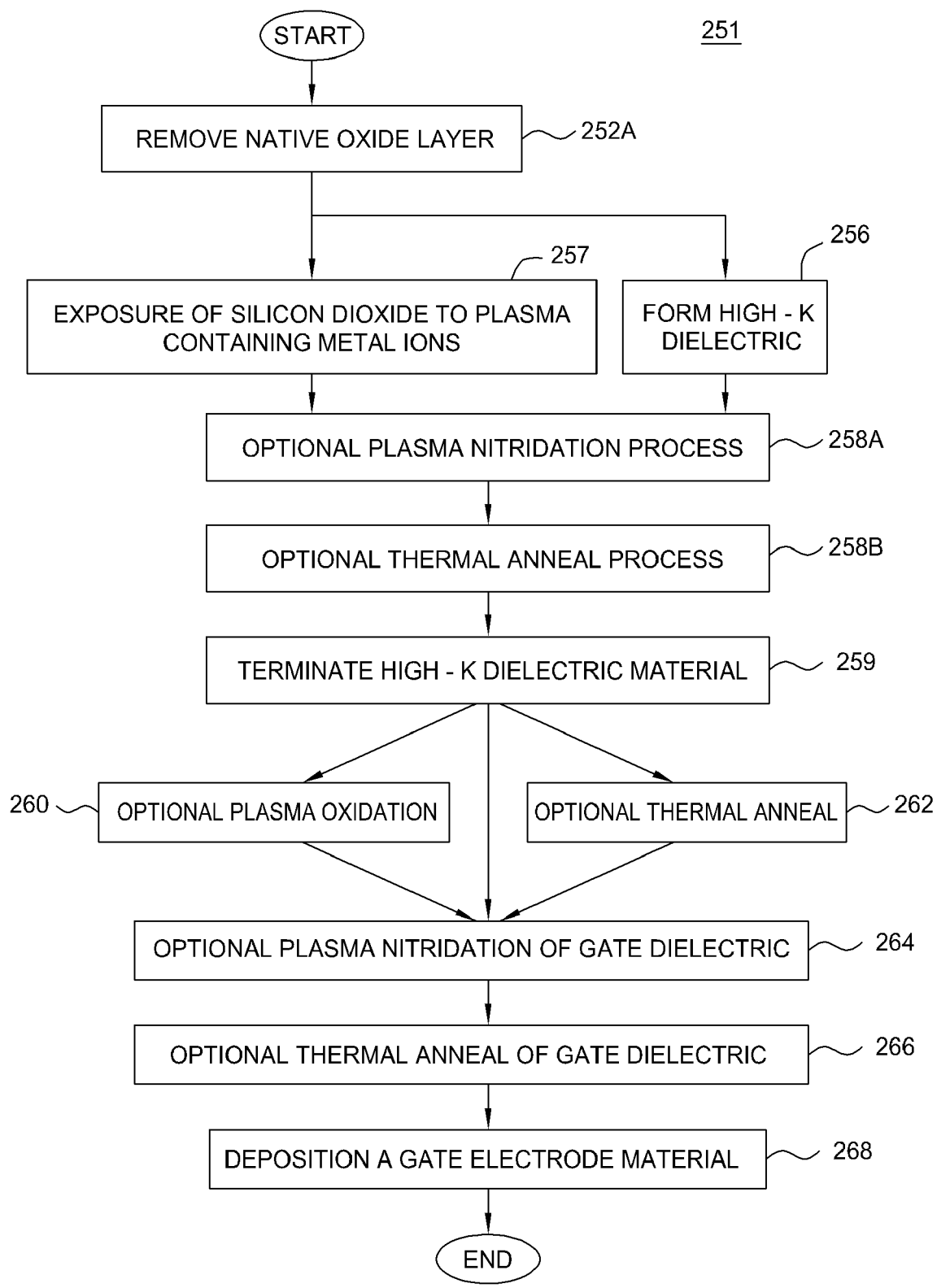
FIG. 2E is a process flow diagram illustrating a method for fabricating a gate dielectric of a field effect transistor in accordance with one embodiment of the present invention.

FIG. 2E illustrates another embodiment of the process sequence 251. The process sequence 251 illustrated in FIG. 2E are the same as the steps illustrated in FIG. 2A except that step 254 has been removed, and step 252 has been modified (new step 252A) to allow a wet cleaning process to form an interfacial silicon oxide containing layer. In this embodiment, the new step 252A cleans and intentionally forms an oxide layer on the surface 401B of the substrate using a wet cleaning process. The new step 252A may be performed in an Emersion™ chamber that is available from Applied Materials Inc., Santa Clara, Calif. In one example, a 4 to 5 angstroms (Å) oxide layer is formed during step 252A by immersing the substrate for 8 minutes in a dilute hydrofluoric acid (HF) bath, then rinsing and immersing the substrate in a standard clean 1 (SC1) bath (e.g., <5% vol. of ammonium hydroxide ($NH_4OH$)/<3% vol. of hydrogen peroxide ($H_2O_2$)/balance DI water) that is maintained at 50° C. for 6 minutes, and then rinsing the substrate in a megasonic actuated tank (i.e., 1500 W) containing DI water for a desired period of time. In another example, an oxide layer may be formed by wet clean process that uses an ozone ($O_3$) containing cleaning solution.

Figure 2F:
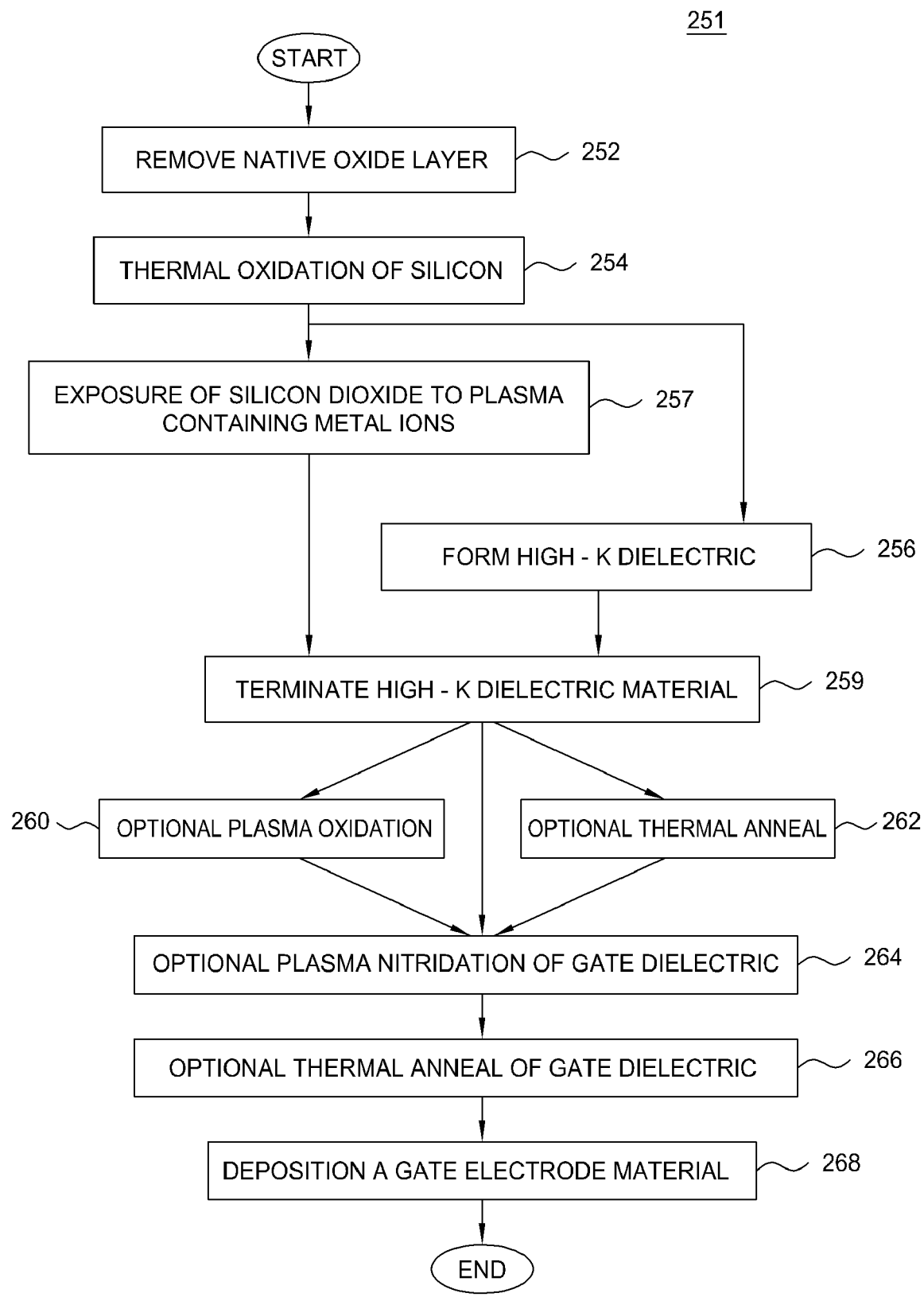
FIG. 2F is a process flow diagram illustrating a method for fabricating a gate dielectric of a field effect transistor in accordance with one embodiment of the present invention.

FIG. 2F illustrates another embodiment of the process sequence 251. The process sequence 251 illustrated in FIG. 2F are the same as the steps illustrated in FIG. 2A except that step 256 is performed after step 254. In this embodiment, the order that steps 256 and 254 are performed has been changed to allow a thin silicon dioxide ($SiO_2$) layer (e.g., <10 Å) to be formed prior depositing the high-k dielectric layer during steps 256. In one embodiment, a thin high-k dielectric layer 404 is deposited on a thermal oxide layer 402, which is grown in step 254, using an ALD type deposition process. This configuration is believed to be useful since the formed thin silicon dioxide layer during step 254 will provide a good dielectric/channel region interface at the junction between the dielectric layer and the channel region of the device, while providing desirable dielectric characteristics of the complete stack.

Hardware Aspects of the Design

As discussed above, it is desirable to form a high-k dielectric layer using a plasma treatment process that is discussed in conjunction with steps 257 and 259 discussed above. Plasma processes that use large plasma potentials, for example on the order of tens of volts can cause damage to the thin gate dielectric layers and even cause incorporation of the bombarding metal atoms into the underlying channel region of the formed MOS device. The damage to a dielectric layer, such as silicon dioxide or incorporation of the metal atoms into the underlying regions is undesirable due to a reduction in device performance and increased current leakage. The various embodiments discussed below can be used to reliably form a gate dielectric layer using a plasma treatment process. Examples of various apparatuses that may be used to perform such a metal plasma treatment is described below in conjunction with FIGS. 4A-4C and 4F.

Inductively Coupled Plasma Processing Chamber

FIG. 4A illustrates a schematic cross-sectional view of one embodiment of a plasma processing chamber 500 that can be used to perform the processes described in steps 257 and/or 259 above. In this configuration, the processing chamber 500 is an inductively coupled plasma processing chamber that is able to process a substrate 502, such as substrate 401 (FIG. 3A), in a processing region 522. In one embodiment, the processing chamber 500 is a modified Decoupled Plasma Nitridation (DPN) Chamber that is available from Applied Materials of Santa Clara, which uses inductively coupled RF source.

The process chamber 500 generally contains an inductive RF source assembly 591, a DC source assembly 592, a target 505, a system controller 602, a process chamber assembly 593, and a substrate support assembly 594. The process chamber assembly 593 generally contains the components that can form a vacuum in the processing region 522 so that a plasma process can be performed therein. In general the process chamber assembly 593 will contain a chamber base 527, chamber walls 528 and chamber lid 529 that sealably enclose the processing region 522. The processing region 522 can be evacuated to a desired vacuum pressure by the use of a vacuum pump 510 that is connected to the processing region 522 through the chamber base 527 and/or chamber walls 528. Generally, the chamber walls 528 and chamber base 527 may be formed from a metal, such as aluminum, or other suitable material. In one embodiment, the chamber walls 528 may have removable chamber shields (not shown) that prevent the sputtered material from the target 505 from landing on the chamber walls 528.

The inductive RF source assembly 591 generally contains an RF generator 508 and an RF match 508A that are connected to a coil 509 that is positioned adjacent to the chamber lid 529. In one embodiment, the RF generator 508 may operate at between about 0 and about 3000 W at a frequency between about 400 kHz and about 20 MHz. In one example, the RF generator 508 operates at a frequency of 13.56 MHz. The chamber lid 529 is generally a dielectric component (e.g., quartz, ceramic material) that is adapted to allow the RF energy delivered from the inductive RF source assembly 591 to form a plasma in the processing region 522. In one embodiment, the coil 509 may be positioned close to the target 505 so that the plasma generated in the processing region 522 is formed near the active surface of the target during the sputtering process. Control of the plasma near the active surface can help control the plasma density near the region of the target that is being sputtered during the low energy sputter deposition process. This configuration may also be useful to reduce the amount of unwanted plasma bombardment of the ultra-thin gate dielectric layer due to the plasma generated by the coil 509.

In one embodiment, the chamber lid 529 is modified to allow a vacuum-sealed electrical feed-through 504 to contact the target 505 that is positioned in the processing region 522. In this configuration, a coaxial cable 506 is connected from vacuum-sealed electrical feed-through 504 to deliver energy from the DC power supply 507 to cause ions created in the plasma to sputter material from the target 505 onto the substrate 502. In one aspect, discussed below in conjunction with FIGS. 5A-5C the system controller 602 is used to synchronize the output from the RF generator 508 and the DC power delivered from the DC source 592 assembly. In one embodiment, the target 505 may be formed from a pure material or alloy containing an element selected from a group hafnium (Hf), lanthanum (La), aluminum (Al), titanium (Ti), zirconium (Zr), strontium (Sr), lead (Pb), yttrium (Y), or barium (Ba).

In one aspect, the process chamber assembly 593 also contains a gas delivery system 550 that is adapted to deliver one or more process gasses into the processing region 522 formed by the chamber base 527, the chamber walls 528 and the chamber lid 529. The pressure in the processing region 522 can be controlled by use of the system controller 602 that is used to adjust of the flow rate of gas delivered by the gas delivery system 550 and the pumping speed of the vacuum pump 510 that is regulated by the throttle valve 511. In one aspect, the chamber pressure during processing is between about 5 mTorr and about 100 mTorr.

The substrate support assembly 594 generally includes a substrate support 562 that contains a substrate supporting member 562A. The substrate supporting member 562A may be a conventional electrostatic chuck that can be used to actively hold the substrate during processing or simply a substrate support pedestal. A temperature controller 561 is generally adapted heat and/or cool the substrate supporting member 562A to a desired temperature set by temperature controller 561 by use of conventional means, such embedded resistive heating elements or fluid cooling channels that are coupled to a heat exchanger (not shown). In one aspect, the temperature controller 561 is adapted to operate and heat a substrate 502 positioned on the substrate supporting member 562A to a temperature between about 20° C. and about 800° C. During processing the substrate support 562 may be connected to a RF generator 523 so that an RF bias can be applied to portions of the substrate support 562 to pull the ions present in the plasma that has been generated in the processing region 522 to a surface of the substrate 502. In one embodiment, the substrate supporting member 562A is grounded, DC biased, or is electrically floating during the plasma process in order to minimize ion bombardment damage of substrate 502.

Delivering RF energy from the RF generator 508 to the processing region 522 causes the gas atoms in the processing region to become ionized. The ionized gas atoms in the plasma are then attracted to the target 505 due to a cathodic bias applied to the target 505 by the DC source assembly 592 so that material can be sputtered from the target 505 and land on a surface of the substrate 502. In an effort to reduce the interference and interaction of the RF energy delivered from the inductive RF source assembly 591 and the DC bias applied from the DC source assembly 592 it is often desirable to synchronize the pulses of energy delivered from the DC source assembly 592 and RF source assembly 591 so that the interference can be minimized while the deposition rate, film uniformity and film quality is maximized. Pulsing an inductive RF source to excite the plasma mitigates the problems associated with high plasma potentials causing damage to the surface of the substrate by creating and sustaining a low electron temperature, and a low ion energy plasma. Generally, the ions generated by a pulsed RF inductive plasma, which produces ions with low ion energies (e.g., <10 eV) that will not damage a substrate positioned within the plasma. This is described more fully in commonly assigned U.S. Pat. No. 6,831,021, filed Jun. 12, 2003, which is incorporated herein by reference. Theoretical calculations (see FIG. 4D) suggest that the low ion energies of most inert gases, such as Argon (Ar), Neon (Ne), Krypton (Kr) or Xenon (Xe), will not gain enough energy from the pulsed RF source to sputter atoms from a target made from hafnium (Hf), lanthanum (La) or other heavy metals or dielectric materials. For example, for an argon plasma, the sputtering threshold energies of a Hf and La target are 42.3 eV and 25.5 eV, respectively, and a safe ion energy for ion implantation into a gate oxide is generally less than 10 eV. Hence, for an RF inductive plasma, ion energies that are low enough to be safe for forming the gate dielectric layer are not high enough to sputter the desired metal ions from a target material. Therefore, there is a need to use the DC bias applied to the target from the DC source assembly 592 to perform the sputtering process. Aspects, of various pulse deposition process is discussed below in conjunction with FIGS. 5A-5C.

Capacitively Coupled Plasma Processing Chamber

FIGS. 4B-4C illustrates a schematic cross-sectional view of another embodiment of a plasma processing chamber that can be used to perform the processes described in steps 257 and/or 259, shown above. In this configuration, the process chamber 501 is a capacitively coupled plasma processing chamber that is able to process a substrate 502 in a processing region 522. The process chamber 501 generally contains a VHF source assembly 595, a target assembly 573, a system controller 602, a process chamber assembly 596, and a substrate support assembly 594. In this configuration, a capacitively coupled plasma is formed in the processing region 522 between the target 571 and the grounded chamber walls 528 contained in the process chamber assembly 596 by use of a VHF source assembly 595 that is connected to the target 571. The process chamber assembly 596 generally contains all of the components, discussed in conjunction with FIG. 4A above, except the chamber lid 529 has been replaced with the target assembly 573 and electrical insulator 572 that are sealably positioned on the chamber wall 528. The components in the process chamber assembly 596 and the substrate support assembly 594 are the same or similar to those described with reference to the processing chamber 500, and as such, like numbers have been used where appropriate and are not repeated below.

Referring to FIG. 4B, in one embodiment, the VHF source assembly 595 contains a RF source 524 and match 524A that are adapted to deliver RF energy to the processing region 522 through one or more parts of the target assembly 573. The target assembly 573 generally contains a backing plate assembly 570 and a target 571. The backing plate assembly 570 may contain a fluid channel (not shown) to cool the target with a fluid delivered from a heat exchanger (not shown) during processing and a magnetron assembly (not shown) that is adapted to promote the full utilization of the target material and enhance deposition uniformity.

Figure 4E:
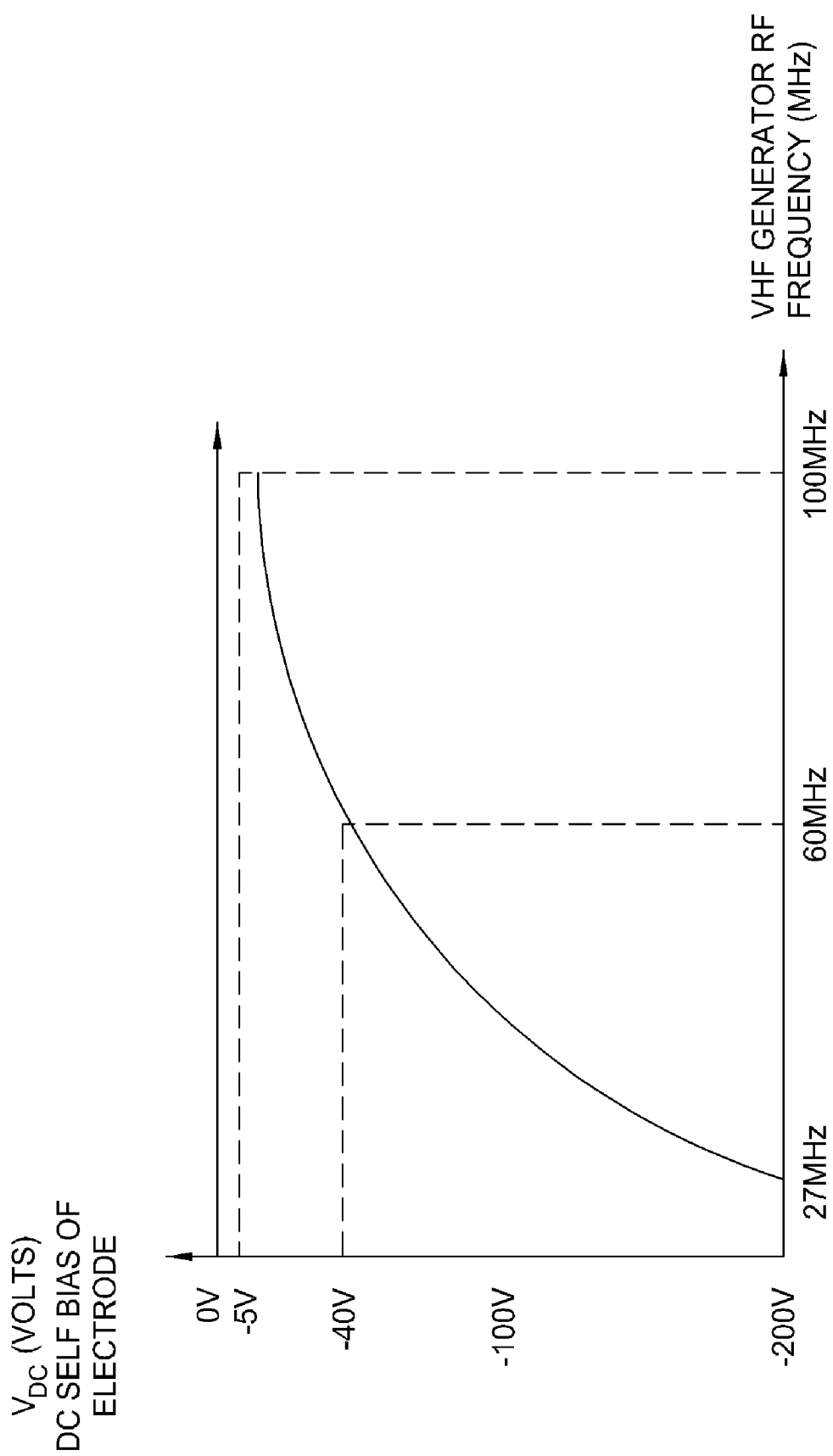
FIG. 4E is a graph of self-bias voltage versus frequency for a capacitively coupled plasma processing chamber according to one embodiment of the invention.

During operation of the process chamber 501 the VHF source assembly 595 is used to bias the target 571 so that the atoms in the material from which the target 571 is formed can be deposited on a surface of the substrate 502. In one embodiment, the RF source 524 in the VHF source assembly 595 is adapted to deliver power to the processing region 522 through the target assembly 573 at an RF frequency between about 1 and about 200 MHz at a power between about 0.01 and about 5 kilowatts (kW). In one embodiment, the VHF source assembly 595 is used to create a self-bias on the capacitively coupled target 571 that provides enough energy, due to the voltage drop across the plasma sheath to cause the ions generated by the plasma to sputter material from the target 571 surface. A capacitively coupled electrode, or the target 571, that is biased using a VHF source will generally reach a self bias voltage, due to the difference in surface area of the anode and cathode (e.g., target 571). The self-bias voltage that the target 571 reaches during processing can be adjusted to optimize the sputter rate of the target 571. FIG. 4E illustrates a graph of the self-bias voltage versus frequency. The graph generally shows the effect of frequency on the self bias voltage of an electrode when it is biased at increasingly higher frequencies. One will note that the self-bias voltage tends to decrease in magnitude as the frequency increases and thus by increasing the frequency of the VHF source assembly 595 the energy of ions striking the target can be reduced. For example, a target that is biased using a RF signal at a frequency of 27 MHz will have a bias voltage of about −200V and a target that is biased using a RF signal at 100 MHz will have a voltage that is only about −10V at a pressure of 50 mTorr using argon and an RF power of 300 W. In another example, the DC bias on the target can be varied from about −50 V to about −20 V by varying the RF frequency between about 60 MHz and about 100 MHz using a constant RF power of about 400 W.

Delivering energy to the target 571 at RF frequencies in the VHF range can improve the process results of steps 257 and/or 259 over processes performed at lower RF frequencies, due to the reduced variation in the DC bias on the target as a function of the variation in frequency and variation in RF power delivered to the target 571. Reducing the variation in the DC bias can be important when performing low power sputtering operations. Therefore, by controlling the frequency of the RF energy and power, such as by delivering the power to the target 571 at a desired duty cycle (discussed below), the DC bias of the target can be accurately and repeatably controlled. The accurate and precise control of the DC bias will assure that the process of doping the ultra-thin gate dielectric layer can be accurately and repeatably performed.

Referring to FIG. 4D, in one example, if the sputtering gas is primarily argon (Ar) and the target is made of lanthanum (La), the energy needed to sputter a lanthanum atoms from the target surface is at least 25.5 eV. This would mean that that the self bias voltage created on the target would need to be high enough to generate an ion energy of about 25.5 eV to assure that some of the lanthanum atoms will be sputtered from the target surface. Therefore, by controlling the frequency and power (e.g., Watts) delivered to the target 571 the sputter rate, the gas atom ion energy, the ion energy of the sputter atoms, and energy of the atoms deposited on the substrate can be controlled. Also, during processing the bias on the substrate support 562 can adjusted to further control the energy that the sputtered atoms have as they deposit on, or implant in, the gate dielectric layer.

Generally, the sputter process can be performed in the process chamber 501 at a chamber pressure in the range between 1 mTorr and about 100 mTorr, using an argon flowrate of between about 1 sccm and about 500 sccm, and heater temperature in a range between about 20° C. and about 800° C. Preferably, the temperature of the substrate is between about 200 and about 300° C. The RF source 524 excitation frequency can be adjusted from about 1 MHz to about 200 MHz to get the correct self bias DC voltage to cause the target material to be sputtered into the plasma and onto the substrate surface. Preferably, the RF source 524 excitation frequency can be adjusted to a frequency between about 27 MHz to about 100 MHz, and more preferably a frequency between about 30 MHz to about 60 MHz. In one example, for a lanthanum target, a frequency of 60 MHz can be selected to provide the desired sputtering energy and sustaining a low energy plasma. In one embodiment, it may be desirable to adjust the spacing between the surface of the substrate 502 and the surface of the target 571 to adjust the uniformity and energy of the sputtered atoms depositing on the substrate surface. In one aspect, it may be desirable to adjust the spacing of the substrate 502 relative to the surface of the target 571 during the deposition process to adjust sputter material depth in the gate oxide layer and/or the deposition uniformity.

FIG. 4C illustrates a second embodiment of the process chamber 501 in which the VHF source assembly 595, shown in FIG. 4B, is replaced with dual VHF source assembly 597 that contains two RF generators 524, 525 that are each adapted to deliver energy to processing region 522 of the process chamber 501 at differing frequencies and/or powers to provide differing sputtering characteristics at different times during the process. The process chamber 501, shown in FIG. 4C, will generally contain a RF source 524, a second RF source 525, a RF switch 526 and a match 524A that are connected to the target assembly 573. In this configuration the energy delivered to the target assembly 573 from the dual VHF source assembly 597 can be switched between the RF source 524 and second RF source 525 by use of the RF switch 526. The state of the switch 526 is controlled by the system controller 602. This embodiment may be useful for target materials that need a fast initial seasoning to remove oxides that may form on the target surface during initial installation or after long idle time. The capability to switch to a lower frequency source (e.g., about 27 MHz or below) will allow a high self bias DC voltage to form on the target 571, leading to a faster target sputtering rate. Thus, after the initial treatment, the output of the dual VHF source assembly 597 can be changed by switching to a higher frequency (e.g., 60 MHz) source to reduce the sputtering rate, and lessen the sputtered atom ion energy, and thus, reducing potential damage to the gate dielectric layer on the substrate surface. In one example, the RF source 524 is able to deliver RF energy at a power between 0 and about 2000 watts at a frequency of about 27 MHz and the second RF source 525 is able to deliver RF energy at a power between 0 and about 500 watts at a frequency between about 40 and about 200 MHz.

In one embodiment, the DC source assembly 592 is optionally connected to the target assembly 573 to deliver one or more pulses of DC energy during the plasma processing step. A DC bias may be superimposed over the VHF signal delivered from the VHF source assembly (e.g., reference numerals 595 and 597). The DC voltage applied to the target 571 can be used to more directly control the energy of the gas atoms ionized striking the target 571 during the sputtering process.

In one embodiment, as discussed above, during processing the substrate support 562 may be connected to a RF generator 523 so that an RF, or VHF, bias can be applied to portions of the substrate support 562 to pull the ions present in a plasma to a surface of the substrate 502. In one embodiment, the substrate supporting member 562A is grounded, DC biased, or is electrically floating during the plasma process in order to minimize ion bombardment damage of substrate 502.

Pulsed Plasma Processing

Figure 5B:
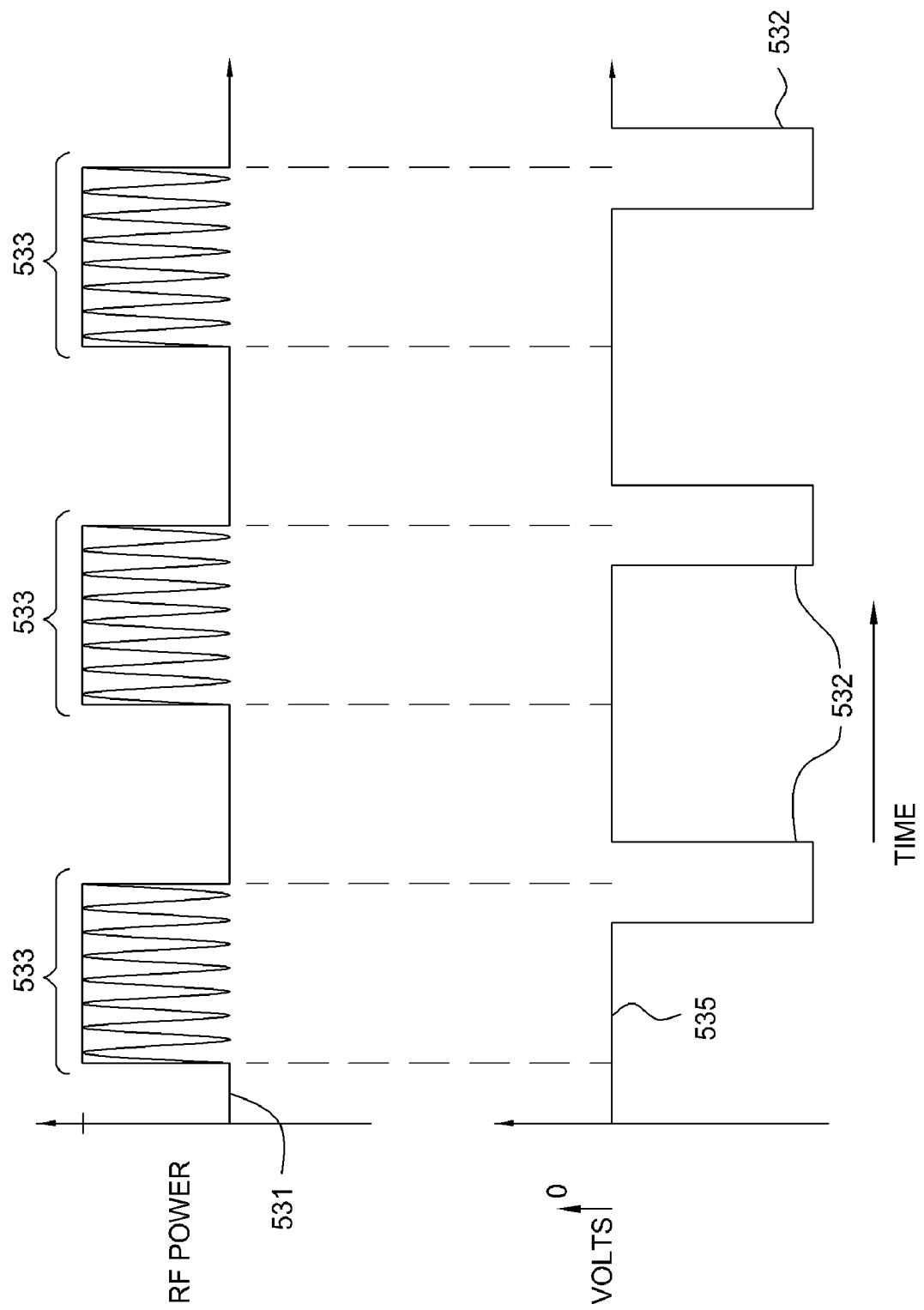
FIG. 5B illustrates the timing of the off-cycle of the pulsed RFNHF excitation energy and pulsed DC voltage applied to a target according to another embodiment of the invention.

FIGS. 5A-5C are diagrammatic representations of various pulsed plasma process that can be used to deposit material sputtered from the target 505, shown in FIG. 4A, or the target 571, shown in FIGS. 4B and 4C, on to a surface of the substrate 502 during steps 257 and/or 259, discussed above. The pulsed plasma processes, as illustrated in FIGS. 5A-5C, are generally a series of sequential energy pulses delivered to the processing region 522 as a function of time by use of the inductive RF source assembly 591 or a VHF source assembly (i.e., VHF source assembly 595 of dual VHF source assembly 597), and the DC energy pulses delivered to the target from the DC source assembly 592. FIG. 5A illustrates a process where the RF energy 531 delivered from the inductive RF source assembly 591 or the VHF source assembly, and the DC voltage 535 delivered from the DC source assembly 592 are plotted as function in time. FIG. 5A illustrates a plot of the RF energy 531 delivered by the inductive RF source assembly 591 or the VHF source assembly 595, and a plot of DC voltage 535 delivered to the target as a function of time, and thus, illustrates one embodiment where the DC, and RF, or VHF, (hereafter RFNHF) pulses are synchronized. In this embodiment, the pulses of RF energy 531 and DC voltage 535 are synchronized so that they are not applied at the same time. Generally, the DC pulses 532 supply a momentary attractive force to the RFNHF excited ions present in the plasma, which causes the ions to accelerate towards target 505 with sufficient energy to sputter material from the target into the plasma. The sputtered material exiting the target surface enters the plasma formed in the processing region 522 during the pulsed RFNHF pulse 533 where it may then become ionized. Depending on whether the substrate supporting member 562A is being RFNHF biased, is grounded or is floating the ionized sputtered atoms can be delivered to the substrate surface with an energy set by the plasma sheath created near the substrate surface. In most cases, it is desirable to synchronize the end of RFNHF pulse 533 so that there is enough plasma in the processing chamber when the DC voltage pulse (or DC current pulses) is delivered to assure that a desired ion density and sputter rate can be achieved when using the low energy bias.

Continuing to refer to FIG. 5A, it is generally desirable, particularly with inductively coupled plasma chamber designs, to create ions during the RFNHF pulse 533 that do not have enough energy to sputter atoms from the target, so that the energy of the sputtered atoms can be more easily controlled by the application of the DC bias to the target. In some cases, it may be desirable to use the RFNHF pulses to ionize the sputtered target atoms so that they can be accelerated and implanted into the surface of the substrate at a low energy by use of a low potential bias applied to the pedestal on which the substrate is positioned. In one aspect, the application of a DC voltage pulse (or DC current pulse) to the target is synchronized with the pulsed RF/VHF off-cycle to allow the energy of the ions generated in the plasma to be more easily controlled by reducing the net increase in plasma energy due to the application of the DC energy. The DC pulsed voltage can be applied at a value that provides enough energy to the argon ions to sputter target materials into the plasma for the doping process.

It should be noted that the system controller 602 can be used to synchronize the RFNHF pulses 533 and the DC pulses 532 and duty cycle to achieve a desired plasma density, sputter deposition rate and plasma ion energy. Referring to FIG. 5A, one will note that the duty cycle, which is the "on" time ($t_1$) divided by the total period of the pulse ($t_3$), of the RF energy 531, can be optimized to assure that a plasma of a desired average density is controlled. One will also note that the duty cycle, which is the "on" time ($t_4$) divided by the total period of the pulse ($t_6$), of the DC voltage 535, can be optimized to assure that a desired average deposition rate is achieved.

Referring to FIGS. 4B-4C and 5A-5C, in one embodiment, the VHF source assembly 595 is set to pulsing mode of at a pulsing frequency of 1 Hz to 50 kHz and a duty cycle of 0.1 to 99%. In this configuration, the pulsed VHF source is used to create and sustain the plasma formed in the processing region 522, while reducing the average plasma density and ion energy. The system controller 602 can be used to adjust the duty cycle, frequency of the pulses, magnitude of the RF energy (i.e., RF power), and the frequency of the RF energy to control the plasma, ion and sputtered material energy. In one embodiment, to deliver low energy sputtered material to the surface of the substrate the system controller 602 is used to deliver RF energy to the coil 509 (FIG. 4A) at a duty cycle between about 1% and about 50%. Alternately, in one embodiment, low energy sputtered material is delivered to the surface of the substrate by delivering RF energy to the target 571 (FIG. 4B) at a duty cycle between about 1% and about 50%. In some cases it is desirable to keep the duty cycle delivered to the coil 509 (FIG. 4A) or the target 571 (FIG. 4B) between about 1% and about 10% to minimize the energy delivered to the ions in the plasma.

FIG. 5B illustrates another embodiment of the pulse plasma process in which the DC pulse 532 is delivered during at least a portion of the pulsed RF energy 531 delivered from the RF source assembly 591 or the VHF source assembly (i.e., VHF source assembly 595 of dual VHF source assembly 597). In yet another embodiment, as shown in FIG. 5C, the RF energy 531 is maintained at a constant level for a period of time $t_1$ and the pulsed DC voltage 535 is delivered to the target 505 while the RF energy is "on." It should be noted that it may be desirable to reduce the magnitude of the RF energy 531 during the DC pulses 532 to reduce any possible interference between the delivered signals. In one embodiment, it may be desirable to bias the substrate support 562 using a RF generator 523 (FIG. 4A) that is used to generate a bias that attracts ions to the substrate positioned thereon during various parts of the RFNHF plasma generation and/or pulsed DC sputtering phases of the process.

In one another embodiment, it is desirable to pulse the RFNHF energy so that the generated ions in the plasma will not have enough energy to sputter the target material. In this case, a DC bias is applied to the target can be used to promote the sputtering of the target material.

In one embodiment, the pulsed RFNHF signal is applied to the substrate support 562 to create and sustain the plasma through the substrate surface. Therefore, in one embodiment, a synchronized DC pulse is delivered to the target 571 and a synchronized VHF pulse is delivered to the substrate support 562 to sputter the target material into the plasma for doping into the gate dielectric.

Grounded Collimator Design

Figure 4F:
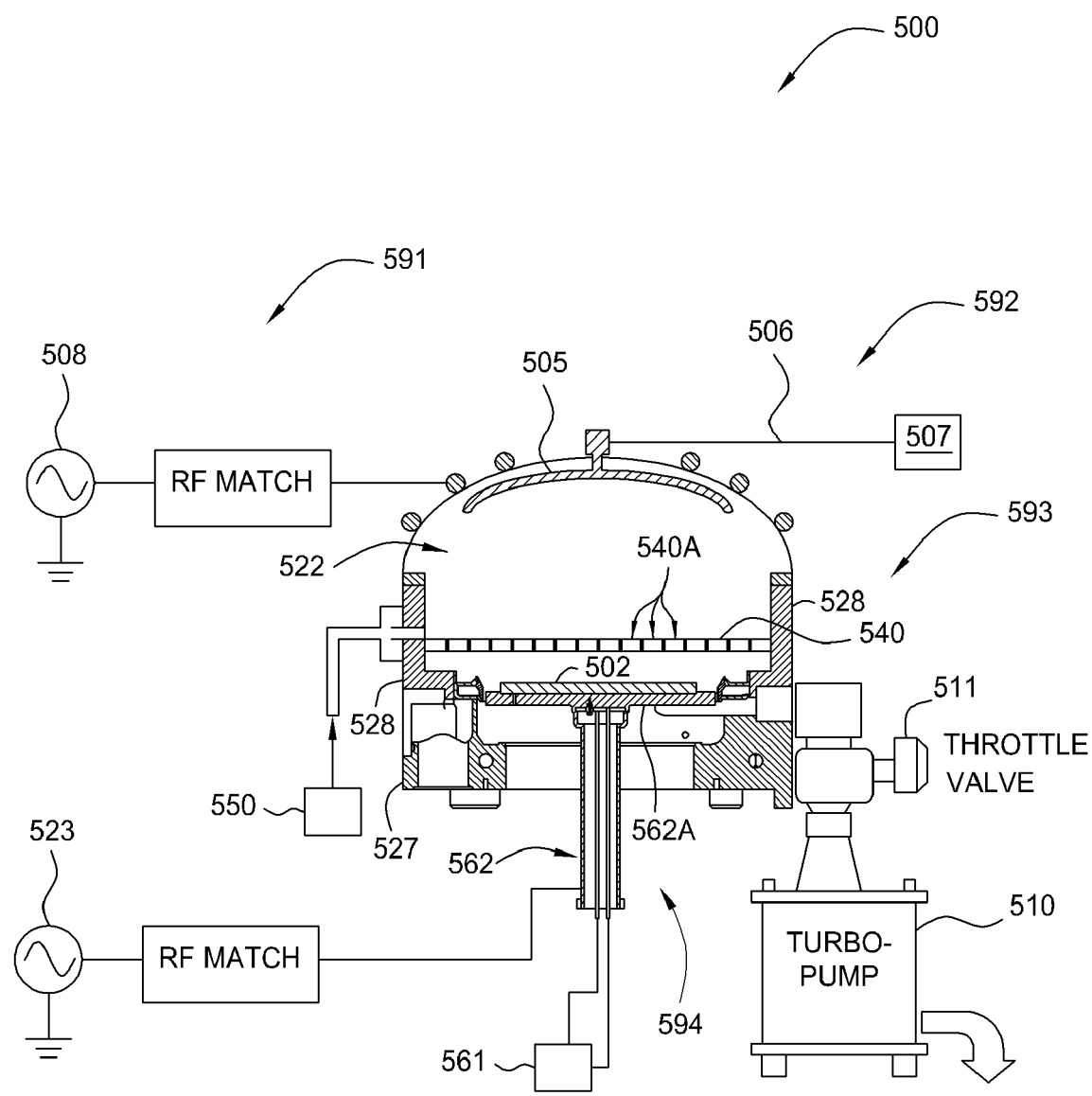
FIG. 4F illustrates a schematic cross-sectional view of a plasma processing chamber according to one embodiment of the invention.

FIG. 4F illustrates a schematic cross-sectional view of another embodiment of a processing chamber 500 that may be used for metal plasma treatment of a gate dielectric layer, namely a low energy sputtering process to form a doped gate dielectric layer. In this embodiment, a grounded collimator 540 is installed between the substrate 502 and target 505 to capture charged metal ions. The addition of the grounded collimator 540 encourages primarily neutral sputtered atoms to reach substrate 502, to form an thin metal layer on the surface of substrate 502, potentially as little as a single monolayer. The collimator is generally a grounded plate or wire mesh that contains a plurality of holes 540A that are distributed across the grounded plate to allow neutral atoms and possibly some ions to pass from the processing region near the target to the surface of the substrate. Depositing such a layer on the surface of a gate dielectric by this method generally creates very little ion bombardment damage, since the energy of the neutrals is generally a fraction of the energy required to sputter an atom from the target surface and the neutrals are not affected the plasma potential. This metal layer may then be incorporated into a subsequently formed oxide film, thus creating a high dielectric constant, or "high-k", dielectric layer without metal or nitrogen ion implantation and the associated problems, such as silicon damage and over penetration of the metal into the underlying silicon layer of the substrate. One skilled in the art would appreciate that the process chamber 501, shown in FIGS. 4B and 4C, could also be adapted to contain a grounded collimator 540 between the target 571 and the surface of the substrate 502 to accomplish the same function of capturing a large percentage of the charged particles in the plasma before they strike the substrate surface to reduce damage of the gate dielectric layer.

Alternate Process Chamber Design

Figure 4G:
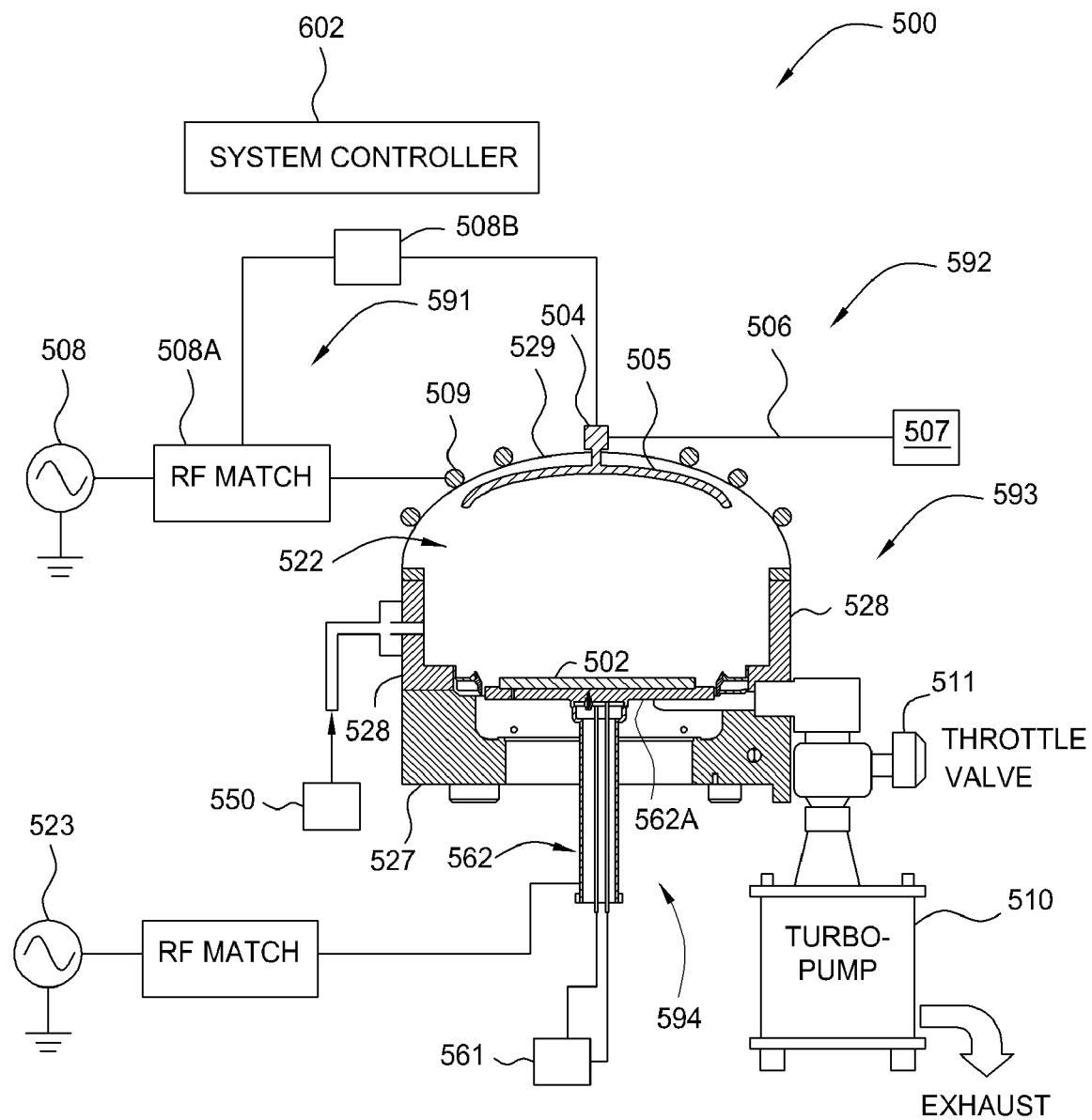
FIG. 4G illustrates a schematic cross-sectional view of a plasma processing chamber according to one embodiment of the invention.

FIG. 4G illustrates a schematic cross-sectional view of another embodiment of a processing chamber 500 that may be used for metal plasma treatment of a gate dielectric layer, namely a low energy sputtering process to form a doped gate dielectric layer. In one embodiment of the process chamber 500, an output of the inductive source assembly 591 is connected to the target 505, so that a plasma can be generated in the processing region 522 by use of the coil 509 and the capacitively coupled target 505. In one embodiment, the target 505 is coupled to an output of the RF match 508A through a coil 508B that is sized to achieve resonance when the power is delivered by the generator 508 through the RF match 508A. Referring to FIG. 4A, the addition of the RF bias of the target 505 allows the coil 509 to generate and shape the plasma, while allowing the RF frequency and RF power delivered to the target 505 to control the DC bias and thus energy of the ions striking the target 505. Also, the use of inductively coupled plasma generating components and a capacitively coupled plasma generating components that can be pulsed at a desired duty cycle allows the DC bias applied to the target (i.e., self-bias), sputter rate, and sputtered ion energy to more easily controlled. By careful control of the chamber pressure, RF frequency, RF power, duty cycle, bias applied to the substrate support 562 and/or the processing time, the amount of the sputtered material and the concentration versus depth of the sputtered material in the dielectric layer can be controlled. The use of a single RF generator 508 and RF match 508A will also reduce the chamber cost and system complexity. In one embodiment, the DC source assembly 592 is coupled to the target 505 so that DC pulses can be delivered to the target 505, during or in between RF pulses delivered by the RF generator 508.

Figure 4H:
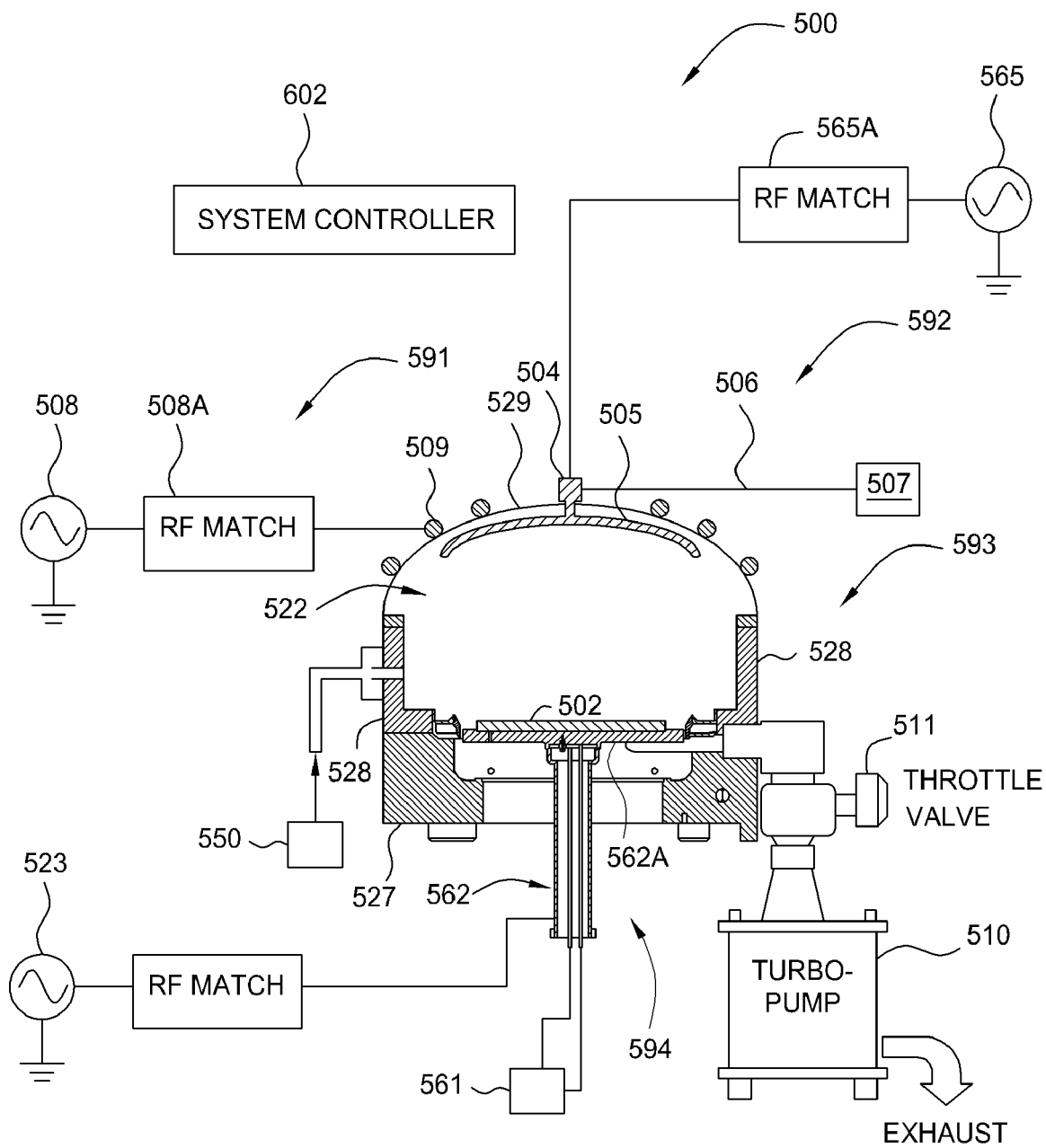
FIG. 4H illustrates a schematic cross-sectional view of a plasma processing chamber according to one embodiment of the invention.

In another embodiment, illustrated in FIG. 4H, it is desirable to have a separate RF generator 565 and RF match 565A that supply RF energy to the target 505, while the coil 509 is separately RF biased by use of the RF generator 508 and RF match 508A. In this configuration the new RF match 565A and RF generator 565 can be separately controlled from the inductive source assembly 591 components by use of the system controller 602. In one aspect, the DC source assembly 592 is also coupled to the target 505 so that DC pulses can be delivered to the target 505, during or in between RF pulses delivered by the inductive RF source assembly 591 components and/or the RF generator 565.

Plasma Processing System

One or more plasma processing chambers, such as that described above in FIGS. 4A-4C, and 4F, may be beneficially integrated into a multi-chamber, multi-process substrate processing platform, such as integrated processing system 600, illustrated in FIG. 7. Examples of integrated processing systems that may be adapted to benefit from the invention are described in commonly assigned U.S. Pat. No. 5,882,165, filed on Mar. 16, 1999; U.S. Pat. No. 5,186,718, filed on Feb. 16, 1993; and U.S. Pat. No. 6,440,261, filed on Aug. 27, 2002, which are hereby incorporated by reference in their entireties. The integrated processing system 600 may include a factory interface 604, load ports 605A-D, system controller 602, vacuum loadlocks 606A, 606B, a transfer chamber 610, and a plurality of substrate processing chambers 614A-614F. One or more of the substrate processing chambers 614A-F may be configured as plasma processing chambers, such as processing chamber 500 and/or one or more process chambers 501, that are used to perform a plasma treatment, described herein in conjunction with FIGS. 2-5, discussed above. In other embodiments, the integrated processing system 600 may include greater than six processing chambers.

In accordance with aspects of the present invention, the integrated processing system 600 generally comprises a plurality of chambers and robots, and is preferably equipped with a system controller 602 programmed to control and carry out the various processing methods and sequences performed in the integrated processing system 600. The system controller 602 is generally designed to facilitate the control and automation of the overall system and typically may includes a central processing unit (CPU) (not shown), memory (not shown), and support circuits (or I/O) (not shown). The CPU may be one of any form of computer processors that are used in industrial settings for controlling various system functions, chamber processes and support hardware (e.g., detectors, robots, motors, gas sources hardware, etc.) and monitor the system and chamber processes (e.g., chamber temperature, process sequence throughput, chamber process time, I/O signals, etc.). A robot 613 is centrally disposed in the transfer chamber 610 to transfer substrates from the load lock chambers 606A or 606B to one of the various processing chambers mounted in positions 614A-F. The robot 613 generally contains a blade assembly 613A, arm assemblies 613B which are attached to the robot drive assembly 613C. The robot 613 is adapted to transfer the substrate "W" to the various processing chambers by use of commands sent from the system controller 602. A robot assembly that may be adapted to benefit from the invention is described in commonly assigned U.S. Pat. No. 5,469,035, entitled "Two-axis magnetically coupled robot", filed on Aug. 30, 1994; U.S. Pat. No. 5,447,409, entitled "Robot Assembly" filed on Apr. 11, 1994; and U.S. Pat. No. 6,379,095, entitled Robot For Handling Semiconductor Substrates", filed on Apr. 14, 2000, which are hereby incorporated by reference in their entireties. A plurality of slit valves (not shown) may be utilized to selectively isolate each of the process chambers 614A-614F from the transfer chamber 610 so that each chamber may be separately evacuated to perform a vacuum process during the processing sequences described herein.

An important benefit to the integration of a plasma chamber into integrated processing system 600 is that sequential process steps may be performed on a substrate without exposure to air. This allows processes such as the deposition of the sputtered atoms on the surface of the substrate, described above in conjunction with FIGS. 2-5, to take place without oxidation of the newly deposited ultra-thin metal layer(s). Uncontrolled oxidation of freshly-deposited materials prior to performing a stabilization anneal is also avoided by the integration of multiple process chambers into the integrated processing system 600, which include a process chamber that can perform an anneal step. An integrated system will prevent the oxidation of the materials (e.g., dopant materials) found within the high-k dielectric layer 403, or high-k dielectric layer 404, by not exposing the substrate to ambient sources of oxygen that will occur in non-integrated processes. The contamination found in non-integrated processes can thus directly affect the device fabrication process repeatability and average device performance.

In one embodiment of the integrated processing system 600, the substrate processing chamber 614A or chamber connected to the factory interface 604 may be configured to perform an RCA clean as mentioned above in process step 252. Then, after removal of native oxide layer 401A (see FIG. 3A), a substrate may then have a dielectric layer (e.g., thermal oxide layer 402, high-k dielectric layer 404) formed thereon using a conventional rapid thermal oxidation (RTO) process, plasma enhanced chemical vapor deposition (PECVD), or ALD performed in processing chamber 614B. The substrate processing chambers 614C and 614D are configured as a plasma processing chambers similar to processing chamber 500 and/or process chamber 501, described above, to perform process steps 257 and 259. Therefore, a plasma process can be performed on the substrate in processing chamber 614C and 614D while maintaining the substrate under vacuum, thereby preventing the native oxide from re-growing on the various layers disposed on the substrate. This may be particularly important where the exposed layers that contain materials that have a high affinity to oxygen, such as lanthanum. In one aspect, the step 260 is sequentially performed on the substrate in substrate processing chambers 614E to oxidize the metal surface that was formed in substrate processing chamber 614D. In an alternative aspect, step 262 may be performed in an RTP chamber placed in substrate processing chamber 614E. Then, a plasma nitridation process (step 264), such as a DPN process available from Applied Materials, may be performed in the processing chamber 614F. In another aspect, step 266 may be performed in an RTP chamber placed in substrate processing chamber 614E, or substrate processing chamber 614F, if available.

In another embodiment, the step 252 (i.e., native oxide removal step) and the step 254 (i.e., formation of thermal oxide layer deposition step) may be performed in a different system. In this embodiment, substrate processing chambers 614A and 614B may be configured as a plasma processing chambers similar to processing chamber 500 and/or process chamber 501 to perform process steps 257 and 259. In one aspect, the step 260 is sequentially performed on the substrate in substrate processing chambers 614C to oxidize the metal surface that was formed in substrate processing chamber 614B. In another aspect, alternatively, step 262 may be performed in an RTP chamber 614C. Then a plasma nitridation process (step 264), such as a DPN process available from Applied Materials, may be performed in the processing chamber positioned in the substrate processing chamber 614D. In one aspect, step 266 may be performed in an RTP chamber 614E, or substrate processing chamber 614C, if available. In one aspect, after step 260 is completed in substrate processing chamber 614C, a surface nitridation step may be performed in substrate processing chamber 614D, without the substrate being removed from vacuum and exposed to air.

Alternate Method of Forming a Gate Oxide Layer

Figure 6A:
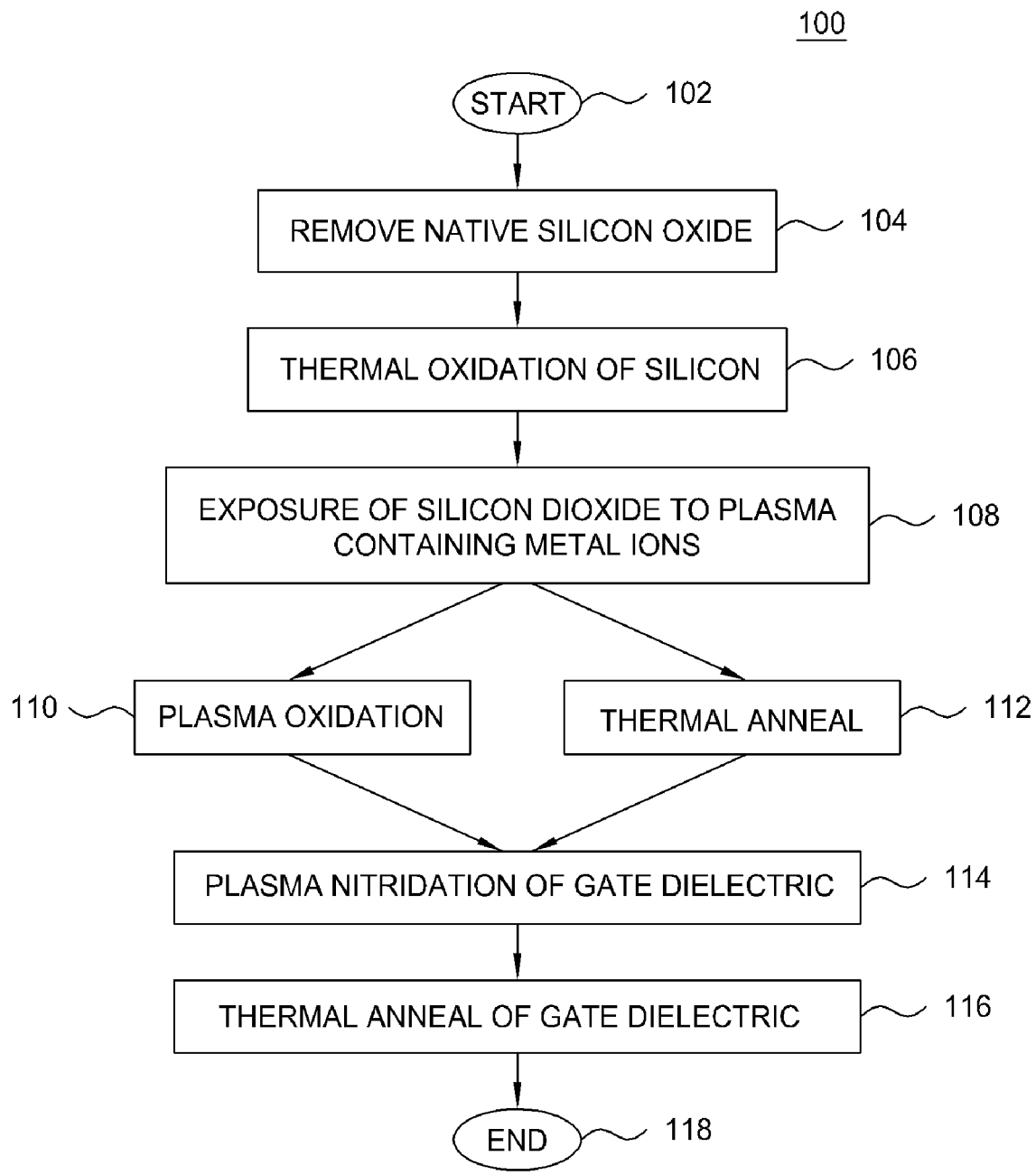
FIG. 6A is a process flow diagram illustrating a method 100 for fabricating a gate dielectric of a field effect transistor in accordance with one embodiment of the present invention.

FIG. 6A is a process flow diagram illustrating a method 100 for fabricating a gate dielectric of a field effect transistor in accordance with one embodiment of the present invention. The method 100 includes processing steps performed upon a substrate during fabrication of the gate structure of an exemplary CMOS field effect transistor. FIG. 6A illustrates a pictorial summary of the complete process of method 100. At least portions of the method 100 may be performed using processing reactors of an integrated semiconductor substrate processing system (i.e., a cluster tool). One such processing system is the CENTURA® integrated processing system, available from Applied Materials, Inc. of Santa Clara, Calif.

FIGS. 6B-6G illustrate a series of schematic cross-sectional views of a substrate upon which a gate structure is fabricated using the method of FIG. 6A. The cross-sectional views in FIGS. 6B-6G relate to individual processing steps performed to fabricate the gate dielectric in a larger gate structure (not shown) of a transistor. The images in FIGS. 6B-6G are not depicted to scale and are simplified for illustrative purposes.

Figure 6B:
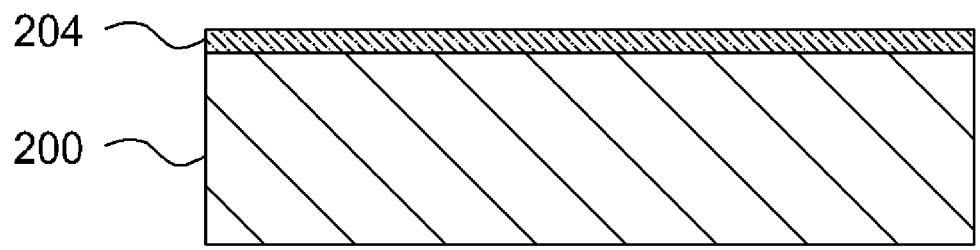
FIGS. 6B-6G illustrate a series of schematic cross-sectional views of a substrate upon which a gate structure is fabricated using the method of FIG. 6A.

The method 100 starts at step 102 and proceeds to step 118. Referring first to FIG. 6A and FIG. 6B, at step 104, a silicon (Si) substrate 200 is provided (e.g., 200 mm wafer, 300 mm wafer) and exposed to a solution for removing a native oxide ($SiO_2$) layer 204 from a surface of the substrate. In one embodiment, the layer 204 is removed using a cleaning solution comprising hydrogen fluoride (HF) and deionized (DI) water (i.e., a hydrofluoric acid solution). In one embodiment, the cleaning solution is an aqueous solution that contains between about 0.1 and about 10% by weight of HF that is maintained at a temperature between about 20 and about 30° C. In another embodiment, the cleaning solution has about 0.5 wt % of HF is maintained at a temperature of about 25° C. During step 104 the substrate 200 can be immersed into the cleaning solution, and then rinsed in de-ionized water. Step 104 may be performed in either a single substrate processing chamber or a multiple substrate batch type processing chamber that may include delivery of ultra-sonic energy during processing. Alternatively, the step 104 may be performed using a single substrate wet cleaning reactor of the integrated processing system 600 (FIG. 7). In another embodiment, the layer 204 may be removed using an RCA clean method. Upon completion of step 104, the substrate 200 is placed in a vacuum load lock or nitrogen ($N_2$) purged environment.

Figure 6C:
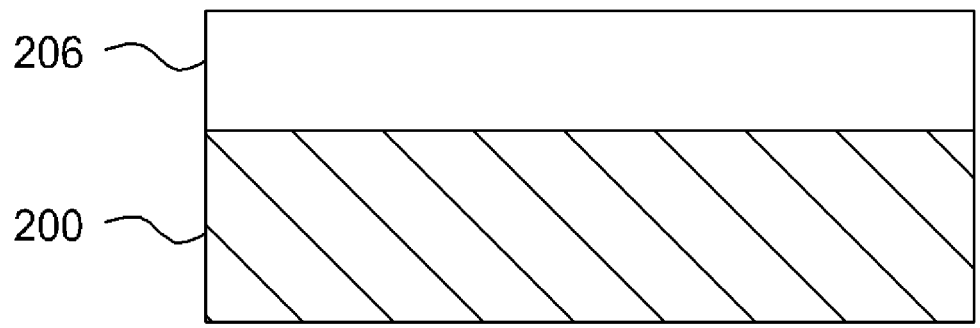

At step 106, a thermal oxide ($SiO_2$) layer 206 is grown on the substrate 200 (FIG. 6C). Generally, the thermal oxide layer 206 may have a thickness between about 3 Angstroms (Å) and about 35 Å. In one embodiment, the thermal oxide layer 206 has a thickness between about 6 Å and about 15 Å.

The process of depositing the thermal oxide layer during step 106 may be performed using an RTP reactor, such as a RADIANCE® RTP reactor positioned on the integrated processing system 600 illustrated in FIG. 7. A RADIANCE® RTP reactor is available from Applied Materials, Inc., of Santa Clara, Calif.

Figure 6D:
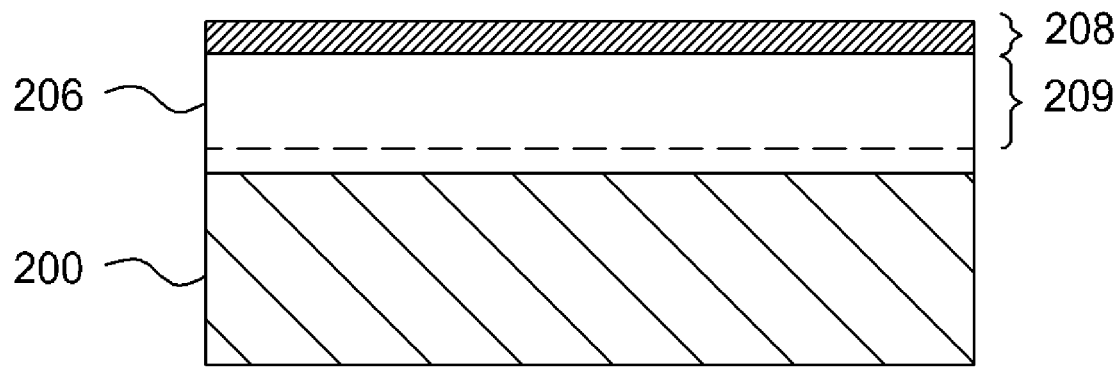

At step 108, thermal oxide layer 206 is exposed to a metal ion containing plasma. Illustratively, step 108 forms a metallic sublayer layer 209 of silicon metal oxide or silicate or oxynitride film on the substrate 200 (FIG. 6D). In one embodiment, a metallic layer 208 having a film thickness between about 1 Å and about 5 Å may be advantageously formed on the surface of the thermal oxide layer 206 during step 108. In one embodiment, the metal ion containing plasma contains an inert gas and at least one metal ion, such as hafnium or lanthanum. The inert gas may contain argon as well as one or more optional inert gases, such as neon (Ne), helium (He), krypton (Kr), or xenon (Xe). In one aspect, the metal ion containing plasma may contain nitrogen ($N_2$) gas.

Figure 6E:
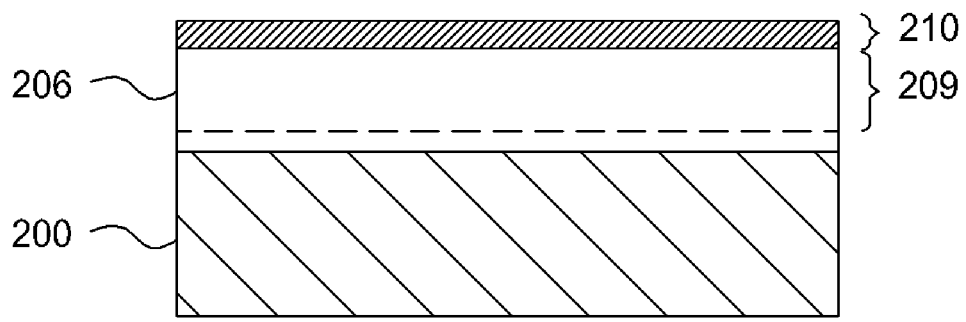

At step 110, thermal oxide layer 206 is exposed to an oxygen containing plasma to oxidize the metallic sublayer 209, and metallic layer 208 when applicable, to convert it into a dielectric region 210 (FIG. 6E). In another embodiment, the plasma may contain nitrogen ($N_2$), as well as well as one or more oxidizing gases, such as $O_2$, NO, $N_2O$. The plasma may also contain one or more inert gases, such as argon (Ar), neon (Ne), helium (He), krypton (Kr), or xenon (Xe). Step 110 can be performed using, for example, a decoupled plasma nitridation (DPN) plasma reactor of the integrated processing system 600 (FIG. 7).

In an alternative embodiment, in which step 112 is used instead of step 110, the substrate 200 is annealed at a temperature between about 800 and about 1100° C. Step 112 can be performed using, a suitable thermal annealing chamber, such as a RADIANCE® or RTP XE⁺ reactor of the integrated processing system 600, or either a single substrate or batch furnace. The thermal oxidation step 112 results in the formation of a dielectric region 210 containing the dielectric materials. In one aspect, the dielectric region 210 may contain a silicate material. In one embodiment, the annealing process of step 112 may performed by providing oxygen ($O_2$) gas at a flow rate between about 2 and about 5000 sccm and nitric oxide (NO) at a flow rate between about 100 and about 5000 sccm, either gas optionally mixed with nitrogen ($N_2$), while maintaining a substrate surface temperature between about 800 and about 1100° C., and a pressure in the reaction chamber between about 0.1 and about 50 Torr. The annealing process may be performed for between about 5 and about 180 seconds. In one example, oxygen ($O_2$) is provided at a flow rate of about 500 sccm while maintaining the chamber at a temperature of about 1000° C. and a pressure of about 0.1 Torr, for a duration of about 15 seconds. In another example, nitric oxide (NO) is provided at a flow rate of about 500 sccm, while maintaining the chamber at a substrate temperature of about 1000° C. and a pressure of about 0.5 Torr, for duration of about 15 seconds.

Figure 6F:
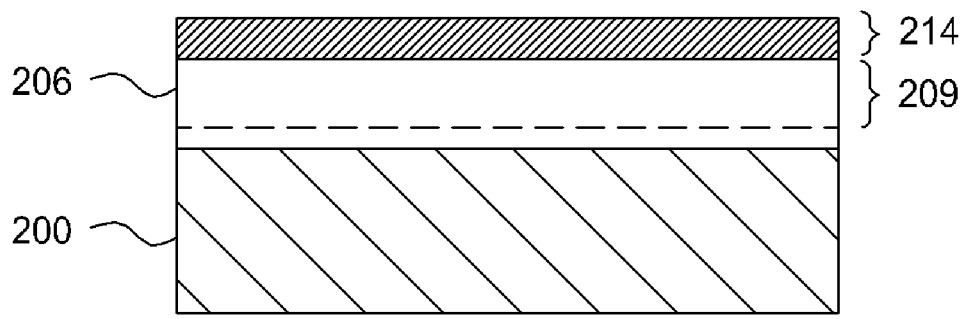

At step 114 the surface of the substrate 200 is exposed to a nitrogen plasma to enhance the amount of nitrogen in the top surface of the formed structure, to form a nitrided layer 214 (FIG. 6F). The process may be formed using a DPN reactor by providing nitrogen ($N_2$) at about 10-2000 sccm, a substrate pedestal temperature of about 20-500° C., and a pressure in the reaction chamber between about 5-1000 mTorr. The radio-frequency (RF) plasma is energized, e.g., at 13.56 MHz, using either a continuous wave (CW) or pulsed plasma power source of up to about 3-5 kW. During pulsing, peak RF power, frequency and a duty cycle are typically selected in the ranges from about 10-3000 W, about 2-100 kHz, and about 2-100%, respectively. This process may be performed for about 1-180 sec. In one embodiment, $N_2$ is provided at about 200 sccm, and about 1000 W of peak RF power is pulsed at about 10 kHz with a duty cycle of about 5% applied to an inductive plasma source, at a temperature of about 25° C. and a pressure of about 100-80 mTorr, for about 15-180 sec. The plasma may be produced using a quasi-remote plasma source, an inductive plasma source, or a radial line slotted antenna (RLSA) source, among other plasma sources. In alternate embodiments, sources of CW and/or pulsed microwave power may be used to form the nitrided layer 214. The nitrided layer 214 may formed on the top surface of the dielectric region 210. (FIG. 6E)

Figure 6G:
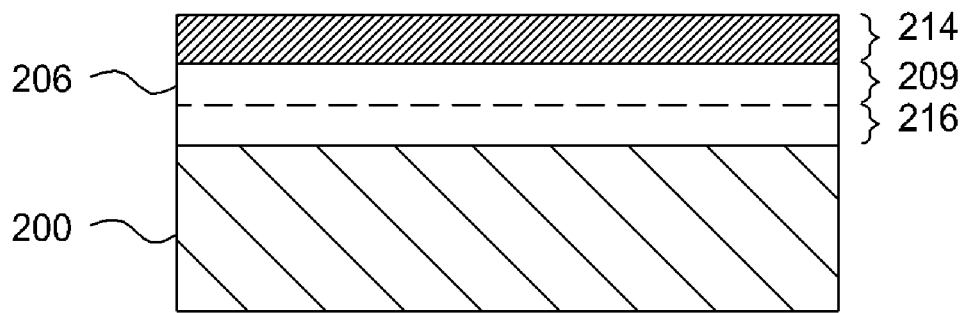

At step 116, the gate dielectric layers 206, 214 and 209 and substrate 200 are annealed. Step 116 improves leakage current reduction of the layers 206, 214 and 209 and increases mobility of charge carriers in the channel region below the silicon dioxide ($SiO_2$) sub-layers 216, as well as improves reliability of the whole gate dielectric. Step 116 can be performed using, a suitable thermal annealing chamber, such as a RADIANCE® or RTP XE⁺ reactor of the integrated processing system 300, or either a single substrate or batch furnace. The thermal oxidation step 116 results in the formation of silicon dioxide ($SiO_2$) sub-layers 216 to form on the silicon dielectric film interface (FIG. 6G). Step 116 increases mobility of charge carriers in the channel region below silicon dioxide ($SiO_2$) sub-layers 216 as well as improves reliability of the dielectric/silicon interface.

In one embodiment, the annealing process of step 116 may performed by providing at least one of oxygen ($O_2$) at about 2-5000 sccm and nitric oxide (NO) at about 100-5000 sccm, either gas optionally mixed with nitrogen ($N_2$), while maintaining a substrate surface temperature of about 800-1100° C., and a pressure in the reaction chamber of about 0.1-50 Torr. The process may be performed for about 5-180 seconds. In one example, oxygen ($O_2$) is provided at about 500 sccm while maintaining the chamber at a temperature of about 1000° C. and a pressure of about 0.1 Torr, for a duration of about 15 seconds.

Upon completion of step 116, at step 118, method 100 ends. In the manufacture of integrated circuits, the method 100 advantageously forms ultra-thin gate dielectrics with improved leakage current reduction and increases mobility of charge carriers in the channel region.

While the foregoing is directed to embodiments of the present invention, other and further embodiments of the invention may be devised without departing from the basic scope thereof, and the scope thereof is determined by the claims that follow.

We claim:

1. A method of forming a high-k dielectric layer using a sputtering process, wherein the sputtering process comprises:
   positioning a substrate having a dielectric layer formed thereon in a processing region of a plasma processing chamber;
   disposing a first material in the dielectric layer using a sputtering process, wherein the sputtering process comprises:
      delivering a plurality of RF energy pulses from a first RF generator to a target comprising the first material, wherein the RF energy of each pulse is delivered at a first RF frequency; and
      delivering a plurality of DC energy pulses to the target from a DC source assembly, wherein the plurality of RF energy pulses and the plurality of DC pulses are synchronized.

2. The method of claim 1, wherein the RF energy pulses and the DC energy pulses do not overlap in time.

3. The method of claim 1, wherein the first RF frequency is between about 1 MHz and about 200 MHz.

4. The method of claim 1, wherein the thickness of the dielectric layer is less than about 30 Angstroms.

5. The method of claim 1, wherein the dielectric layer contains a material selected from a group consisting of silicon dioxide, zirconium oxide, hafnium silicate oxides, lanthanum oxides, and aluminum oxide.

6. The method of claim 1, wherein the first material comprises a material selected from a group consisting of aluminum, titanium, zirconium, hafnium, lanthanum, strontium, lead, yttrium, and barium.

7. The method of claim 1, wherein the plurality of RF energy pulses and the plurality of DC energy pulses are delivered at a pulsing frequency between about 1 Hz and about 50 kHz.

8. A method of forming a high-k dielectric layer using a sputtering process, wherein the sputtering process comprises:
positioning a substrate having a dielectric layer formed thereon in a processing region of a plasma processing chamber;
disposing a first material in the dielectric layer using a low energy sputtering process, wherein the sputtering process comprises:
delivering a first amount of RF energy to a target comprising the first material for a first period of time, wherein the first amount of RF energy is delivered at a first RF frequency; and
delivering a second amount of RF energy to the target for a second period of time, wherein the second amount of RF energy is delivered at a second RF frequency, wherein the second frequency is greater than the first frequency.

9. The method of claim 8, wherein the first RF frequency and the second RF frequency are between about 1 MHz and about 200 MHz.

10. The method of claim 8, wherein the thickness of the dielectric layer is less than about 30 Angstroms.

11. The method of claim 8, wherein the dielectric layer contains a material selected from a group consisting silicon dioxide, zirconium oxide, hafnium silicate oxides, lanthanum oxides, and aluminum oxide.

12. The method of claim 8, wherein the first material comprises a material selected from a group consisting of aluminum, titanium, zirconium, hafnium, lanthanum, strontium, lead, yttrium, and barium.

13. A method of forming a high-k dielectric layer using a sputtering process, wherein the sputtering process comprises:
positioning a substrate having a dielectric layer formed thereon in a processing region of a plasma processing chamber;
disposing a first material in the dielectric layer using a sputtering process, wherein the sputtering process comprises:
delivering a first plurality of RF energy pulses from a first RF generator to a coil that is in electrical communication with the processing region, wherein the RF energy is delivered at a first RF frequency and a first power; and
delivering a plurality of DC pulses to a target comprising the first material from a DC source assembly, wherein the plurality of RF energy pulses and the plurality of DC pulses are synchronized.

14. The method of claim 13, wherein the first plurality of RF energy pulses and the plurality of DC pulses do not overlap in time.

15. The method of claim 13, wherein the first RF frequency is between about 40 kHz and about 20 MHz.

16. The method of claim 13, wherein the thickness of the dielectric layer is less than about 30 Angstroms.

17. The method of claim 13, wherein the dielectric layer contains a material selected from a group consisting silicon dioxide, zirconium oxide, hafnium silicate oxides, lanthanum oxides, and aluminum oxide.

18. The method of claim 13, wherein the first material comprises a material selected from a group consisting of aluminum, titanium, zirconium, hafnium, lanthanum, strontium, lead, yttrium, and barium.

19. The method of claim 13, further comprising delivering a second plurality of RF energy pulses from a second RF generator to the target, wherein the second plurality of RF energy pulses and the plurality of DC pulses are synchronized.

20. The method of claim 13, further comprising delivering the first plurality of RF energy pulses from the first RF generator to the target.

21. The method of claim 19, wherein the first plurality of RF energy pulses and the second plurality of RF energy pulses are delivered at a pulsing frequency between about 1 Hz and about 50 kHz.

22. A method of forming a high-k dielectric layer using a sputtering process, wherein the sputtering process comprises:
positioning a substrate having a dielectric layer formed thereon in a processing region of a plasma processing chamber;
disposing a first material in the dielectric layer using a sputtering process, wherein the sputtering process comprises:
delivering a first plurality of RF energy pulses from a first RF generator at a first RF frequency to a coil that is in electrical communication with the processing region; and
delivering a second plurality of RF energy pulses from a first RF generator at a second RF frequency to a target that is in electrical communication with the processing region.

23. The method of claim 22, wherein the first RF frequency is between about 40 kHz and about 20 MHz and the second RF frequency is between about 1 MHz and about 200 MHz.

24. The method of claim 22, wherein the thickness of the dielectric layer is less than about 30 Angstroms.

25. The method of claim 22, wherein the dielectric layer contains a material selected from a group consisting silicon dioxide, zirconium oxide, hafnium silicate oxides, lanthanum oxides, and aluminum oxide.

26. The method of claim 22, wherein the first material comprises a material selected from a group consisting of aluminum, titanium, zirconium, hafnium, lanthanum, strontium, lead, yttrium, and barium.

27. The method of claim 22, wherein the first plurality of RF energy pulses and the second plurality of RF energy pulses are delivered at a pulsing frequency between about 1 Hz and about 50 kHz.

* * * * *

UNITED STATES PATENT AND TRADEMARK OFFICE
CERTIFICATE OF CORRECTION

PATENT NO. : 7,837,838 B2  Page 1 of 1
APPLICATION NO. : 11/614027
DATED : November 23, 2010
INVENTOR(S) : Chua et al.

It is certified that error appears in the above-identified patent and that said Letters Patent is hereby corrected as shown below:

In the Brief Description of the Drawings:

Column 5, Line 11, please delete "RFNHF" and insert -- RF/VHF -- therefor;

Column 5, Line 14, please delete "RFNHF" and insert -- RF/VHF -- therefor;

In the Detailed Description:

Column 14, Line 13, please delete "D1" and insert -- DI -- therefor;

Column 14, Line 16, please delete "D1" and insert -- DI -- therefor;

Column 19, Line 53, please delete "RFNHF" and insert -- RF/VHF -- therefor;

Column 19, Line 57, please delete "RFNHF" and insert -- RF/VHF -- therefor;

Column 19, Line 62, please delete "RFNHF" and insert -- RF/VHF -- therefor;

Column 19, Line 64, please delete "RFNHF" and insert -- RF/VHF -- therefor;

Column 20, Line 1, please delete "RFNHF" and insert -- RF/VHF -- therefor;

Column 20, Line 8, please delete "RFNHF" and insert -- RF/VHF -- therefor;

Column 20, Line 12, please delete "RFNHF" and insert -- RF/VHF -- therefor;

Column 20, Line 26, please delete "RFNHF" and insert -- RF/VHF -- therefor;

Column 21, Line 6, please delete "RFNHF" and insert -- RF/VHF -- therefor;

Column 21, Line 9, please delete "RFNHF" and insert -- RF/VHF -- therefor;

Column 21, Line 13, please delete "RFNHF" and insert -- RF/VHF -- therefor.

Signed and Sealed this
Fifteenth Day of March, 2011

David J. Kappos
*Director of the United States Patent and Trademark Office*